(12) United States Patent
Wang et al.

(10) Patent No.: US 11,049,874 B2
(45) Date of Patent: Jun. 29, 2021

(54) NOR-TYPE MEMORY DEVICE AND METHOD OF FABRICATING THE SAME

(71) Applicants: Chen-Chih Wang, Taipei (TW); Li-Wei Ho, Taipei (TW)

(72) Inventors: Chen-Chih Wang, Taipei (TW); Li-Wei Ho, Taipei (TW)

( * ) Notice: Subject to any disclaimer, the term of this patent is extended or adjusted under 35 U.S.C. 154(b) by 0 days.

(21) Appl. No.: 16/813,035

(22) Filed: Mar. 9, 2020

(65) Prior Publication Data

US 2020/0343260 A1 Oct. 29, 2020

Related U.S. Application Data

(60) Provisional application No. 62/837,890, filed on Apr. 24, 2019.

(51) Int. Cl.
*H01L 27/11582* (2017.01)
*H01L 23/528* (2006.01)
(Continued)

(52) U.S. Cl.
CPC .... *H01L 27/11582* (2013.01); *G11C 11/4087* (2013.01); *H01L 21/02532* (2013.01);
(Continued)

(58) Field of Classification Search
None
See application file for complete search history.

(56) References Cited

U.S. PATENT DOCUMENTS

| 2015/0194435 A1* | 7/2015 | Lee | H01L 27/11582 |
| | | | 257/329 |
| 2017/0148809 A1* | 5/2017 | Nishikawa | H01L 23/5226 |

(Continued)

*Primary Examiner* — Bo B Jang
(74) *Attorney, Agent, or Firm* — Muncy, Geissler, Olds & Lowe, P.C.

(57) ABSTRACT

The invention discloses a NOR-type memory device and a method of fabricating such NOR-type memory device. The NOR-type memory device according to a preferred embodiment of the invention includes a semiconductor substrate, a plurality of bit lines formed on the semiconductor substrate, a plurality of first isolation stripes, a plurality of second isolation stripes, a plurality of multi-layer stripes, a plurality of memory cells, a plurality of first sub-bit lines, a plurality of second sub-bit line, a plurality of word lines, an insulating layer, a plurality of grounded via contacts, and a grounding layer. The first isolation stripes and the second isolation stripes extend in a longitudinal direction defined by the semiconductor substrate. Each memory cell corresponds to one of the columns and one of the rows defined by the semiconductor substrate. The memory cells on one side of each first isolation stripe and the memory cells on the other side of said one first isolation stripe are staggeredly arranged. Each word line corresponds to one of the columns and connects the gate conductors of the memory cells along the corresponding column. The insulating layer is formed on the multi-layer stripes, the first isolation stripes and the second isolation stripes. Each of the grounded via contacts corresponds to one of the second sub-bit lines, and is formed through the insulating layer to connect the corresponding second sub-bit line. The grounding layer is formed on the insulating layer to connect all of the grounded via contacts.

14 Claims, 43 Drawing Sheets

(51) Int. Cl.
  *H01L 27/11556* (2017.01)
  *H01L 23/522* (2006.01)
  *H01L 21/02* (2006.01)
  *H01L 21/762* (2006.01)
  *H01L 21/3213* (2006.01)
  *H01L 21/768* (2006.01)
  *H01L 27/11519* (2017.01)
  *H01L 27/11565* (2017.01)
  *H01L 21/28* (2006.01)
  *G11C 11/408* (2006.01)
  *H01L 27/108* (2006.01)

(52) U.S. Cl.
  CPC .. *H01L 21/32133* (2013.01); *H01L 21/76224* (2013.01); *H01L 21/76802* (2013.01); *H01L 21/76877* (2013.01); *H01L 23/528* (2013.01); *H01L 23/5226* (2013.01); *H01L 27/10829* (2013.01); *H01L 27/10861* (2013.01); *H01L 27/11519* (2013.01); *H01L 27/11556* (2013.01); *H01L 27/11565* (2013.01); *H01L 29/40114* (2019.08); *H01L 29/40117* (2019.08); *H01L 21/02595* (2013.01)

(56) References Cited

U.S. PATENT DOCUMENTS

2017/0200733 A1\* 7/2017 Lee ................... H01L 27/11504
2017/0294445 A1\* 10/2017 Son ....................... H04L 5/0091
2019/0123060 A1 4/2019 Wang \* cited by examiner

US 11,049,874 B2

NOR-TYPE MEMORY DEVICE AND METHOD OF FABRICATING THE SAME

CROSS-REFERENCE TO RELATED APPLICATION

This utility application claims priorities to U.S. Provisional Application Ser. No. 62/837,890, filed Apr. 24, 2019, which is incorporated herein by reference.

BACKGROUND OF THE INVENTION

1. Field of the invention

The invention relates to a NOR-type memory device and a method of fabricating the same, and more in particular, to a NOR-type memory device including a plurality of vertical current type fan-shaped field effect transistors and a method of fabricating such memory device.

2. Description of the prior art

Referring to FIG. 1 and FIG. 2, those drawings schematically illustrate a vertical current type fan-shaped field effect transistor (FanFET) 1 disclosed by US patent publication no. 20190123060A1. FIG. 1 is a perspective view of the vertical current type FanFET 1. FIG. 2 is a cross-sectional schematic drawing of the vertical current type FanFET 1 taken along the A-A line of FIG. 1.

As shown in FIG. 1 and FIG. 2, the vertical current type FanFET 1 includes a pillar 10 of a semiconductor material, extending in a transverse direction T of a semiconductor substrate (not shown in FIGS. 1 and 2), a gate dielectric layer 12 and a gate conductor 14. The semiconductor substrate also defines a normal direction N and a longitudinal direction L as shown in FIG. 1.

The pillar 10 of a semiconductor material has a base side face 100 perpendicular to the transverse direction T, a tapered side face 101 opposite to the base side face 100, a top face 102 parallel to the transverse direction T, a bottom face 103 opposite to the top face 102, a front side face 104 adjacent to the base side face 100 and the tapered side face 101, and a rear side face 105 opposite to the front side face 104. A first elongated portion 106, sandwiched among the base side face 100, the front side face 104, the top face 102 and the rear side face 105, forms a source region. A second elongated portion 107, sandwiched among the base side face 100, the front side face 104, the rear side face 105 and the bottom face 103, forms a drain region. A plate portion 108 on the base side face 100 and between the first elongated portion 106 and the second elongated portion 107 forms a channel region. Other portion of the pillar 10 forms a body region. The gate dielectric layer 12 is formed to overlay the base side face 100 of the pillar 10 of the semiconductor material. The gate conductor 14 is formed to overlay the gate dielectric layer 12.

Obviously, in the vertical current type FanFET 1, the pillar 10 of the semiconductor material extends in the transverse direction T of the semiconductor substrate, and the first elongated portion 106 of the source region and the second elongated portion 107 of the drain region are oppositely arranged up and down in the pillar 10 of the semiconductor material.

To achieve a smaller size, NOR-type memory devices of the prior arts utilize various vertical transistors. In this manner, the NOR-type memory devices may have cell sizes of $4F^2$ by using such vertical transistors stacked either below or above the grounding layer, where F represents a process feature size (i.e., the minimum lithographic feature size). However, the cell sizes of $4F^2$ are already the limit of NOR-type memory devices of these prior arts.

SUMMARY OF THE INVENTION

Accordingly, one scope of the invention is to provide a NOR-type memory device including such vertical current type fan-shaped field effect transistors and a method of fabricating such memory device. In particular, the NOR-type memory device according to the may have a cell size of less than $4F^2$.

A NOR-type memory device according to the first preferred embodiment of the invention includes a semiconductor substrate, a plurality of bit lines, a plurality of first isolation stripes, a plurality of second isolation stripes, a plurality of multi-layer stripes, a plurality of memory cells, a plurality of first sub-bit lines, a plurality of second sub-bit line, a plurality of word lines, a plurality of grounded via contacts, and a grounding layer. The semiconductor substrate defines a longitudinal direction, a transverse direction, a normal direction, a plurality of columns in the longitudinal direction, and a plurality of rows in the transverse direction. The plurality of bit lines are formed on the semiconductor substrate. Each bit line corresponds to one of the rows and extends in the corresponding row. The plurality of first isolation stripes are formed on the bit lines and extend in the longitudinal direction. Each first isolation stripe has a respective first longitudinal edge and a respective second longitudinal edge. The plurality of second isolation stripes are formed on the bit lines and extend in the longitudinal direction. Each second isolation stripe has a respective third longitudinal edge and a respective fourth longitudinal edge. The first isolation stripes and the second isolation stripes are alternatingly arranged. The plurality of multi-layer stripes are constituted by a first semiconductor layer formed on the bit lines, a first insulating layer formed on the first semiconductor layer and a second semiconductor layer formed on the first insulating layer. Each multi-layer stripe corresponds to one of the first isolation stripes and to one of the second isolation stripes, and is located between the corresponding first isolation stripe and the corresponding second isolation stripe. Each multi-layer stripe has a plurality of recesses being formed at the first insulating layer and facing the third longitudinal edge or the fourth longitudinal edge of the corresponding second isolation stripe. The recesses at one side of each first isolation stripe and the recesses at the other side of said one first isolation stripe are staggeredly arranged. Each recess corresponds to one of the columns and to one of the rows. Each of the memory cells corresponds to one of the recesses, and includes a respective pillar of a semiconductor material. Each pillar of the semiconductor material is fitted in the corresponding recess and extends in the transverse direction. Each pillar of the semiconductor material has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face to form a respective source region. Each pillar of the semiconductor material also has a respective second elongated portion sandwiched among the bottom face, the base side face, the front side face and the rear side face to form a respective drain region. Each pillar of the semiconductor material also has a respective plate portion on the base side face and between the first elongated portion and the second elongated portion to form a respective channel region, and other portion of the pillar forming a respective body region. Each memory cell also includes a respective gate oxide (i.e., tunneling oxide)/gate dielectric multi-layer overlaying the base side face of the corresponding pillar of the semiconductor material and a respective gate conductor overlaying the gate oxide/gate dielectric multi-layer. Each first sub-bit line is formed at the first semiconductor layer, and corresponds to one of the memory cells and to one of the bit lines. Each first sub-bit line connects between the drain region of the corresponding memory cell and the corresponding bit line. Each second sub-bit line is formed at the second semiconductor layer, and corresponds to one of the memory cells. Each second sub-bit line connects the source region of the corresponding memory cell. Each of the word lines corresponds to one of the columns, and connects the gate conductors along the corresponding column. The NOR-type memory device according to the first preferred embodiment of the invention also includes a second insulating layer. The second insulating layer is formed on the second semiconductor layer, the first isolation stripes and the second isolation stripes. Each of the grounded via contacts corresponds to one of the second sub-bit lines, and is formed through the second insulating layer to connect the corresponding second sub-bit line. The grounding layer is formed on the second insulating layer to connect all of the grounded via contacts.

In one embodiment, the base side face can be planar, convex or concave.

In one embodiment, in each memory cell, a combination of the first top face of the pillar of the semiconductor material, a second top face of the gate oxide/gate dielectric multi-layer and a third top face of the gate conductor can exhibit a semi-ellipse, a semi-circle, a triangle, a finger-like shape or a trapezoid.

On theory, a cell size of the NOR-type memory device according to the first preferred embodiment of the invention is equal to 3.5 times a square of a process feature size.

Further, the NOR-type memory device according to the first preferred embodiment of the invention also includes a third insulating layer and a plurality of connection lines. The third insulating layer is formed to overlay the semiconductor substrate and the bit lines, and is formed between the first isolation stripes, the second isolation stripes and the bit lines. Each of the connection lines corresponds to one of the first sub-bit lines and to one of the bit lines, and is formed through the third insulating layer to connect between the corresponding first sub-bit line and the corresponding bit line.

A method, according to the second preferred embodiment of the invention, of fabrication a NOR-type memory device, firstly, is to form a plurality of bit lines on a semiconductor substrate, where the semiconductor substrate defines a longitudinal direction, a transverse direction, a normal direction, a plurality of columns in the longitudinal direction, and a plurality of rows in the transverse direction. Each bit line corresponds to one of the rows, and extends along the corresponding row. Next, the method according to the second preferred embodiment of the invention is to form a first semiconductor layer on the bit lines. Then, the method according to the second preferred embodiment of the invention is to form a first insulating layer on the first semiconductor layer. Subsequently, the method according to the second preferred embodiment of the invention is to form a second semiconductor layer on the first insulating layer. Afterward, the method according to the second preferred embodiment of the invention is to form a plurality of first trenches parallel to the longitudinal direction and through the first semiconductor layer, the first insulating layer and the second semiconductor layer, where each first trench has a respective first longitudinal side wall, a respective second longitudinal side wall and a plurality of protrusions protruding inwardly. The protrusions on the first longitudinal side wall and the protrusions on the second longitudinal side wall are staggeredly arranged. Next, the method according to the second preferred embodiment of the invention is to form a plurality of first isolation stripes which each is filled in one of the first trenches such that a plurality of multi-layer stripes of the first semiconductor layer, the first insulating layer and the second semiconductor layer and the first isolation stripes are alternately arranged. Then, the method according to the second preferred embodiment of the invention is to form a plurality of second trenches parallel to the longitudinal direction, where each second trench is formed on a portion of one of the multi-layer stripes and through the first semiconductor layer, the first insulating layer and the second semiconductor layer, and has a respective third longitudinal side wall and a respective fourth longitudinal side wall. Subsequently, the method according to the second preferred embodiment of the invention is to partially dope the first semiconductor layer and the second semiconductor layer on the third longitudinal side wall and the fourth longitudinal side wall of each second trench to form a plurality of first conductive portions on the first semiconductor layer and a plurality of second conductive portions on the second semiconductor layer, where each first conductive portion and each second conductive portion correspond to one of the protrusions. Afterward, the method according to the second preferred embodiment of the invention is to remove a plurality of retained portions of the first insulating layer which each corresponds to one of the protrusions such that a plurality of recesses are formed on the third longitudinal side walls and the fourth longitudinal side walls of the second trenches, where the recesses at one side of each first isolation stripe and the recesses at the other side of said one first isolation stripe are staggeredly arranged. Each recess corresponds to one of the columns and one of the rows. Next, the method according to the second preferred embodiment of the invention is to form a plurality of pillars of a semiconductor material, where the pillars of the semiconductor material are arranged in the columns and the rows. Each pillar of the semiconductor material is fitted in one of the recesses, extends in the transverse direction, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face to form a respective source region, a respective second elongated portion sandwiched among the bottom face, the base side face, the front side face and the rear side face to form a respective drain region, a respective plate portion on the base side face and between the first elongated portion and the second elongated portion to form a respective channel region, and other portion of the pillar of the semiconductor material to form a respective body region. Each of the first conductive portions serves as one of a plurality of first sub-bit lines which each correspond to one of the pillars and to one of the bit lines and connects between the drain region of the corresponding pillar and the corresponding bit line. Each of the second conductive portions serves as one of a plurality of second sub-bit lines which each corresponds to one of the pillars and connects the source region of the corresponding pillar. Then, the method according to the second preferred embodiment of the invention is to form a plurality of gate oxide (i.e., tunneling oxide)/gate dielectric multi-layers which each overlays the base side face of one of the pillars of the semiconductor material. Subsequently, the method according to the second preferred embodiment of the invention is to form a plurality of conductor layers which each overlays one of the third longitudinal side wall and the fourth longitudinal side wall of one of the second trenches. Afterward, the method according to the second preferred embodiment of the invention is to partially etch the conductor layers to form a plurality of gate conductors and a plurality of word lines, where each gate conductor overlays one of the gate oxide/gate dielectric multi-layers, each word line corresponds to one of the columns and connects the gate conductors along the corresponding column. Next, the method according to the second preferred embodiment of the invention is to form a plurality of second isolation stripes which each is filled in one of the second trenches. Then, the method according to the second preferred embodiment of the invention is to form a second insulating layer on the second semiconductor layer, the first isolation stripes and the second isolation stripes. Subsequently, the method according to the second preferred embodiment of the invention is to form a plurality of grounded via contacts which each corresponds to one of the second sub-bit lines and is formed through the second insulating layer to connect the corresponding second sub-bit line. Finally, the method according to the second preferred embodiment of the invention is to form a grounding layer on the second insulating layer to connect all of the grounded via contacts.

Further, between the step of forming the plurality of bit lines on the semiconductor substrate and the step of forming the first semiconductor layer on the bit lines, the method according to the second preferred embodiment of the invention is to form a third insulating layer to overlay the semiconductor substrate and the bit lines. Next, the method according to the second preferred embodiment of the invention is to form a plurality of conductive pads which each corresponds to one of the rows and two of the columns and is formed at the corresponding row and the correspond two columns and through the third insulating layer to contact the bit line along the corresponding row. Moreover, in step of forming the plurality of second trenches parallel to the longitudinal direction, the portions of the conductive pads within the second trenches are removed to change the conductive pads into a plurality of connection lines which each corresponds to one of the first sub-bit lines and to one of the bit lines and connects between the corresponding first sub-bit line and the corresponding bit line.

A NOR-type memory device according to the third preferred embodiment of the invention includes a semiconductor substrate, a grounding layer, a plurality of first isolation stripes, a plurality of second isolation stripes, a plurality of multi-layer stripes, a plurality of memory cells, a plurality of first sub-bit lines, a plurality of second sub-bit line, a plurality of word lines, a plurality of bit line via contacts, and a plurality of bit lines. The semiconductor substrate defines a longitudinal direction, a transverse direction, a normal direction, a plurality of columns in the longitudinal direction, and a plurality of rows in the transverse direction. The grounding layer is formed on the semiconductor substrate. The plurality of first isolation stripes are formed on the grounding layer and extend in the longitudinal direction. Each first isolation stripe has a respective first longitudinal edge and a respective second longitudinal edge. The plurality of second isolation stripes are formed on the grounding layer and extend in the longitudinal direction. Each second isolation stripe has a respective third longitudinal edge and a respective fourth longitudinal edge. The first isolation stripes and the second isolation stripes are alternatingly arranged. The plurality of multi-layer stripes are constituted by a first semiconductor layer formed on the grounding layer, a first insulating layer formed on the first semiconductor layer and a second semiconductor layer formed on the first insulating layer. Each multi-layer stripe corresponds to one of the first isolation stripes and to one of the second isolation stripes, and is located between the corresponding first isolation stripe and the corresponding second isolation stripe. Each multi-layer stripe has a plurality of recesses being formed at the first insulating layer and facing the third longitudinal edge or the fourth longitudinal edge of the corresponding second isolation stripe. The recesses at one side of each first isolation stripe and the recesses at the other side of said one first isolation stripe are staggeredly arranged. Each recess corresponds to one of the columns and to one of the rows. Each of the memory cells corresponds to one of the recesses, and includes a respective pillar of a semiconductor material. Each pillar of the semiconductor material is fitted in the corresponding recess and extends in the transverse direction. Each pillar of the semiconductor material has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face to form a respective drain region. Each pillar of the semiconductor material also has a respective second elongated portion sandwiched among the bottom face, the base side face, the front side face and the rear side face to form a respective source region. Each pillar of the semiconductor material also has a respective plate portion on the base side face and between the first elongated portion and the second elongated portion to form a respective channel region, and other portion of the pillar forming a respective body region. Each memory cell also includes a respective gate oxide (i.e., tunneling oxide)/gate dielectric multi-layer overlaying the base side face of the corresponding pillar of the semiconductor material and a respective gate conductor overlaying the gate oxide/gate dielectric multi-layer. Each first sub-bit line is formed at the first semiconductor layer, and corresponds to one of the memory cells. Each first sub-bit line connects between the source region of the corresponding memory cell and the grounding layer. Each second sub-bit line is formed at the second semiconductor layer, and corresponds to one of the memory cells. Each second sub-bit line connects the drain region of the corresponding memory cell. Each of the word lines corresponds to one of the columns, and connects the gate conductors along the corresponding column. The NOR-type memory device according to the third preferred embodiment of the invention also includes a second insulating layer. The second insulating layer is formed on the second semiconductor layer, the first isolation stripes and the second isolation stripes. Each of the bit line via contacts corresponds to one of the second sub-bit lines, and is formed through the second insulating layer to connect the corresponding second sub-bit line. The plurality of bit lines are formed on the second insulating layer. Each bit line corresponds to one of the rows, extends along the corresponding row, and connects the bit line via contacts along the corresponding row.

Further, the NOR-type memory device according to the third preferred embodiment of the invention also includes a third insulating layer and a plurality of connection lines. The third insulating layer is formed to overlay the grounding layer and between the first isolation stripes, the second isolation stripes and the grounding layer. Each of the connection lines corresponds to one of the first sub-bit lines, and is formed through the third insulating layer to connect between the corresponding first sub-bit line and the grounding layer.

A method, according to the fourth preferred embodiment of the invention, of fabrication a NOR-type memory device, firstly, is to form a grounding layer on a semiconductor substrate, where the semiconductor substrate defines a longitudinal direction, a transverse direction, a normal direction, a plurality of columns in the longitudinal direction, and a plurality of rows in the transverse direction. Next, the method according to the fourth preferred embodiment of the invention is to form a first semiconductor layer on the grounding layer. Then, the method according to the fourth preferred embodiment of the invention is to form a first insulating layer on the first semiconductor layer. Subsequently, the method according to the fourth preferred embodiment of the invention is to form a second semiconductor layer on the first insulating layer. Afterward, the method according to the fourth preferred embodiment of the invention is to form a plurality of first trenches parallel to the longitudinal direction and through the first semiconductor layer, the first insulating layer and the second semiconductor layer, where each first trench has a respective first longitudinal side wall, a respective second longitudinal side wall and a plurality of protrusions protruding inwardly. The protrusions on the first longitudinal side wall and the protrusions on the second longitudinal side wall are staggeredly arranged. Next, the method according to the fourth preferred embodiment of the invention is to form a plurality of first isolation stripes which each is filled in one of the first trenches such that a plurality of multi-layer stripes of the first semiconductor layer, the first insulating layer and the second semiconductor layer and the first isolation stripes are alternately arranged. Then, the method according to the fourth preferred embodiment of the invention is to form a plurality of second trenches parallel to the longitudinal direction, where each second trench is formed on a portion of one of the multi-layer stripes and through the first semiconductor layer, the first insulating layer and the second semiconductor layer, and has a respective third longitudinal side wall and a respective fourth longitudinal side wall. Subsequently, the method according to the fourth preferred embodiment of the invention is to partially dope the first semiconductor layer and the second semiconductor layer on the third longitudinal side wall and the fourth longitudinal side wall of each second trench to form a plurality of first conductive portions on the first semiconductor layer and a plurality of second conductive portions on the second semiconductor layer, where each first conductive portion and each second conductive portion correspond to one of the protrusions. Afterward, the method according to the fourth preferred embodiment of the invention is to remove a plurality of retained portions of the first insulating layer which each corresponds to one of the protrusions such that a plurality of recesses are formed on the third longitudinal side walls and the fourth longitudinal side walls of the second trenches, where the recesses at one side of each first isolation stripe and the recesses at the other side of said one first isolation stripe are staggeredly arranged. Each recess corresponds to one of the columns and one of the rows. Next, the method according to the fourth preferred embodiment of the invention is to form a plurality of pillars of a semiconductor material, where the pillars of the semiconductor material are arranged in the columns and the rows. Each pillar of the semiconductor material is fitted in one of the recesses, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face to form a respective drain region, a respective second elongated portion sandwiched among the bottom face, the base side face, the front side face and the rear side face to form a respective source region, a respective plate portion on the base side face and between the first elongated portion and the second elongated portion to form a respective channel region, and other portion of the pillar of the semiconductor material to form a respective body region. Each of the first conductive portions serves as one of a plurality of first sub-bit lines which each correspond to one of the pillars and connects between the source region of the corresponding pillar and the grounding layer. Each of the second conductive portions serves as one of a plurality of second sub-bit lines which each corresponds to one of the pillars and connects the drain region of the corresponding pillar. Then, the method according to the fourth preferred embodiment of the invention is to form a plurality of gate oxide (i.e., tunneling oxide)/gate dielectric multi-layers which each overlays the base side face of one of the pillars of the semiconductor material. Subsequently, the method according to the fourth preferred embodiment of the invention is to form a plurality of conductor layers which each overlays one of the third longitudinal side wall and the fourth longitudinal side wall of one of the second trenches. Afterward, the method according to the fourth preferred embodiment of the invention is to partially etch the conductor layers to form a plurality of gate conductors and a plurality of word lines, where each gate conductor overlays one of the gate oxide/gate dielectric multi-layers, each word line corresponds to one of the columns and connects the gate conductors along the corresponding column. Next, the method according to the fourth preferred embodiment of the invention is to form a plurality of second isolation stripes which each is filled in one of the second trenches. Then, the method according to the fourth preferred embodiment of the invention is to form a second insulating layer on the second semiconductor layer, the first isolation stripes and the second isolation stripes. Subsequently, the method according to the fourth preferred embodiment of the invention is to form a plurality of bit line via contacts which each corresponds to one of the second sub-bit lines and is formed through the second insulating layer to connect the corresponding second sub-bit line. Finally, the method according to the fourth preferred embodiment of the invention is to form a plurality of bit lines on the second insulating layer. Each of the bit lines corresponds to one of the rows, extends along the corresponding row, and connects the bit line via contacts along the corresponding row.

Further, between the step of forming the grounding layer on the semiconductor and the step of forming the first semiconductor layer on the grounding layer, the method according to the fourth preferred embodiment of the invention is to form a third insulating layer to overlay the grounding layer. Next, the method according to the second preferred embodiment of the invention is to form a plurality of conductive pads which each corresponds to one of the rows and two of the columns and is formed at the corresponding row and the correspond two columns and through the third insulating layer to contact the grounding layer. Moreover, in step of forming the plurality of second trenches parallel to the longitudinal direction, the portions of the conductive pads within the second trenches are removed to change the conductive pads into a plurality of connection lines which each corresponds to one of the first sub-bit lines and connects between the corresponding first sub-bit line and the grounding layer.

Distinguishable from the prior art, the NOR-type memory device according to the invention includes such vertical current type fan-shaped field effect transistors, and may have a cell size of less than $4F^2$.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 3:
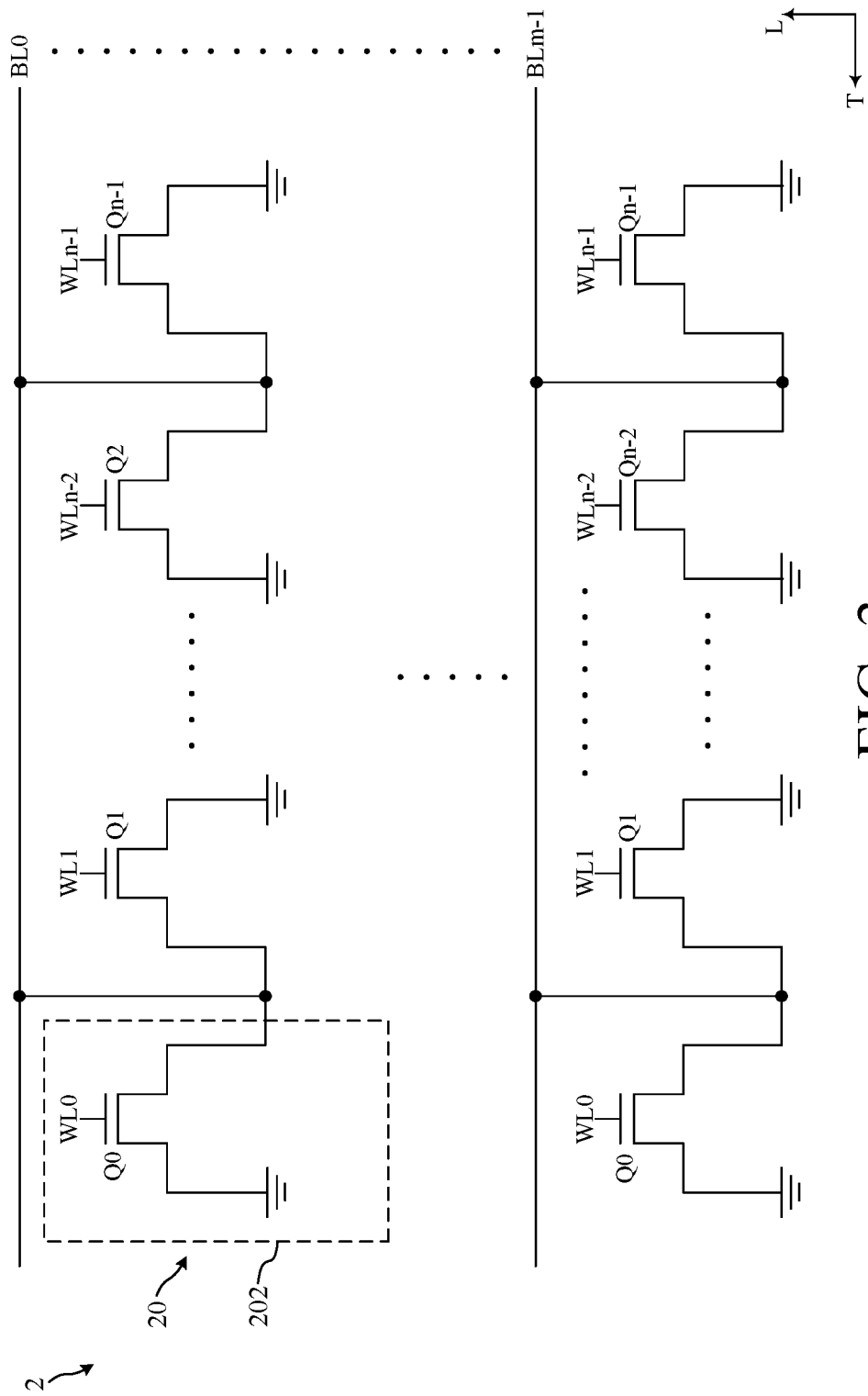
FIG. 3 is an equivalent circuit diagram of a NOR-type memory device according to a preferred embodiment of the invention.

Referring to FIG. 3, FIG. 3 is an equivalent circuit diagram of a NOR-type memory device 2 according to a preferred embodiment of the invention. In greater detail, FIG. 3 is an equivalent circuit diagram of the NOR-type memory device 2 having a vertical channel structure.

As shown in FIG. 3, a memory cell array in the NOR-type memory device 2 according to the invention includes a plurality of memory cell strings 20 in the transverse direction T. Each of the memory cell strings 20 is constituted by a plurality of memory cell blocks 202 connected in parallel to the corresponding one of a plurality of bit lines BL0 to BLm-1. Each of the memory cell strings 20 includes the corresponding one of a plurality of bit lines BL0 to BLm-1 and a plurality of memory cells Q0 to Qn-1. Each of the memory cell blocks 202 is constituted by one of the memory cells Q0 to Qn-1. Each of the memory cells Q0 to Qn-1 is via a drain thereof connected to the corresponding bit line (BL0 to BLm-1), and is via a source thereof connected to a ground. Each of the word lines WL0 to WLn-1 corresponds to one of the columns, and is connected to the gates of the memory cells Q0 to Qn-1 at the same column.

Figure 1:
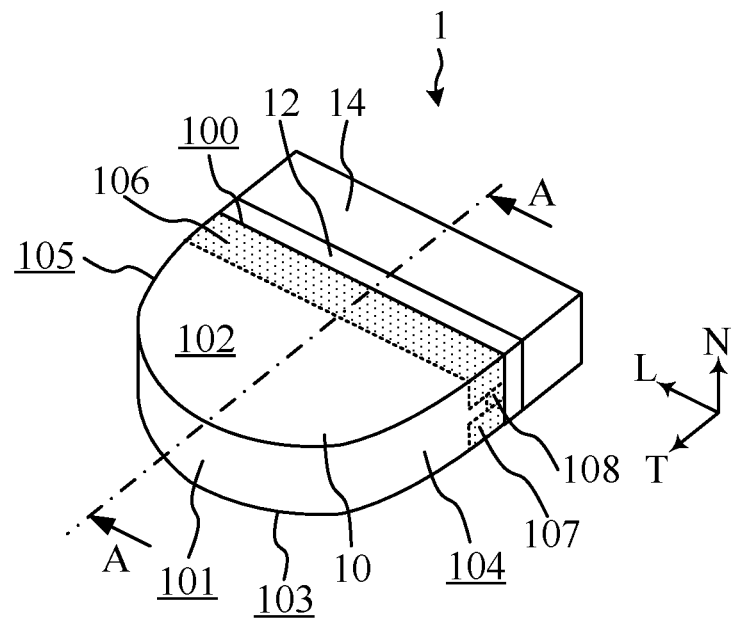
FIG. 1 is a perspective view of a vertical current type FanFET of the prior art.
Figure 2:
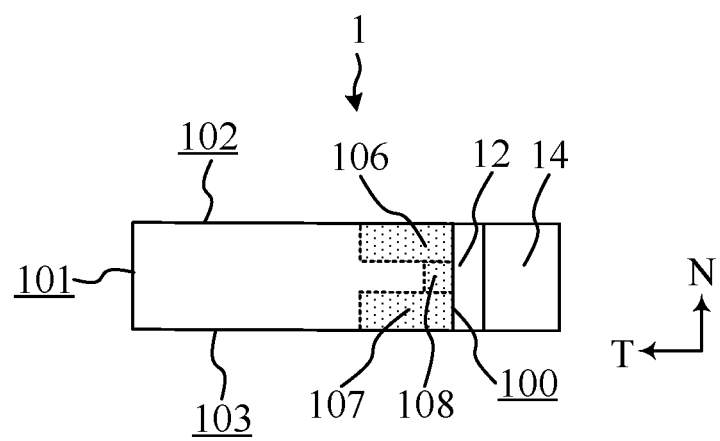
FIG. 2 is a cross-sectional view of the vertical current type FanFET taken along the A-A line of FIG. 1.
Figure 4:
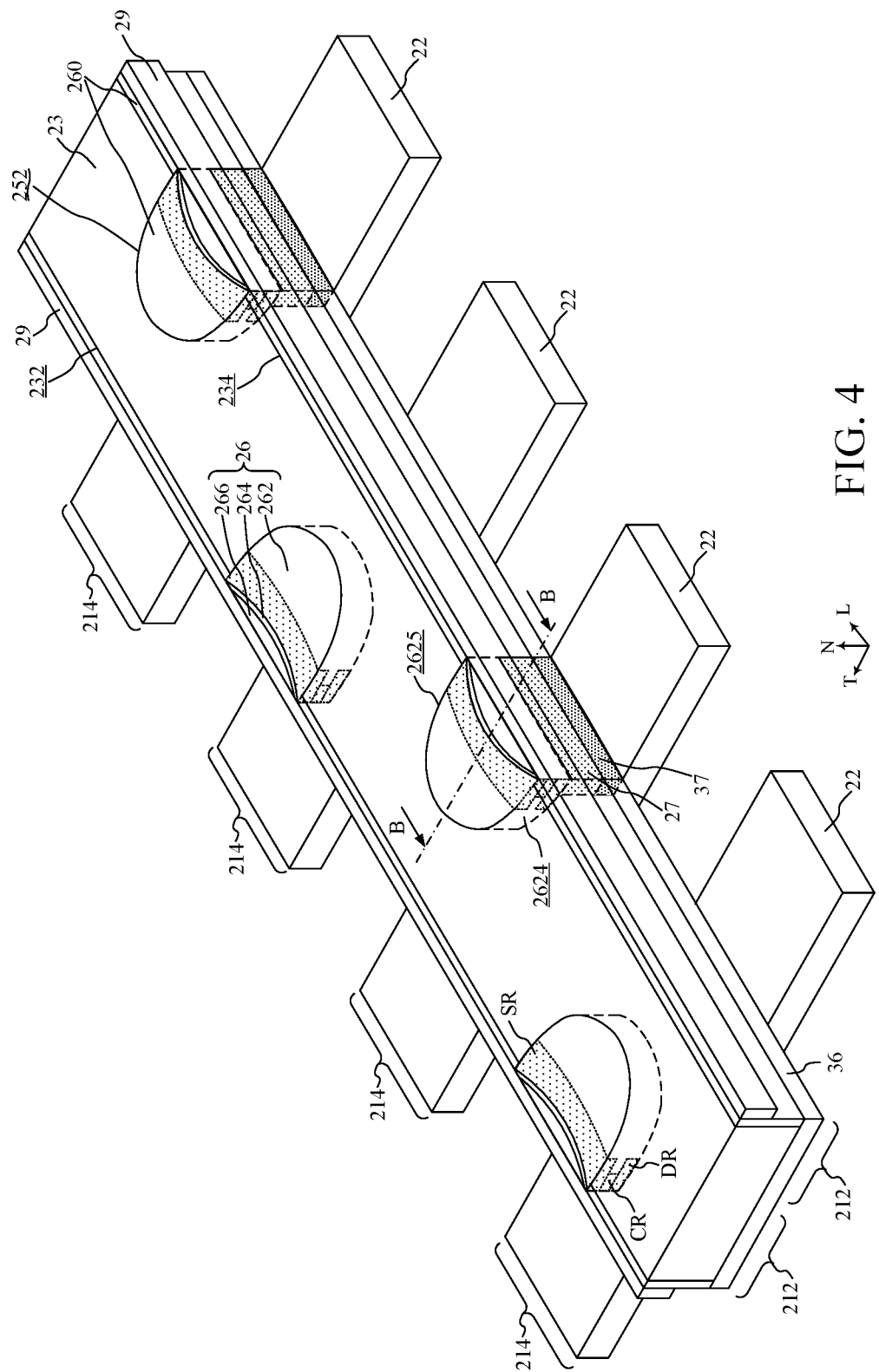
FIG. 4 is a perspective view of partial structure inside the NOR-type memory device according to the first preferred embodiment of the invention.
Figure 5:
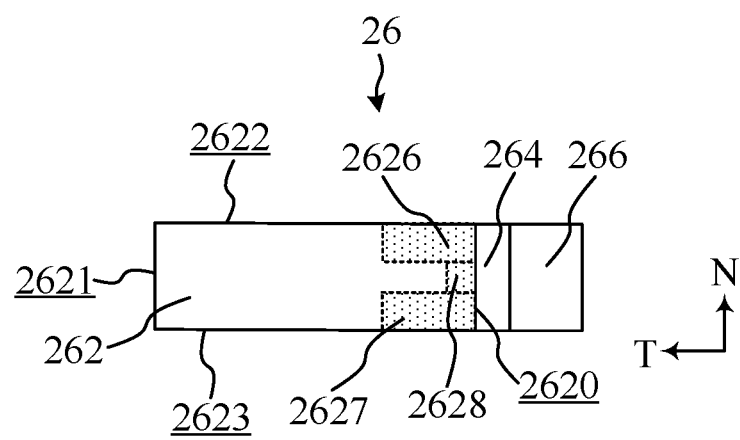
FIG. 5 is a cross-sectional view of a transistor of the NOR-type memory device according to the first preferred embodiment of the invention taken along the B-B line of FIG. 4.
Figure 6:
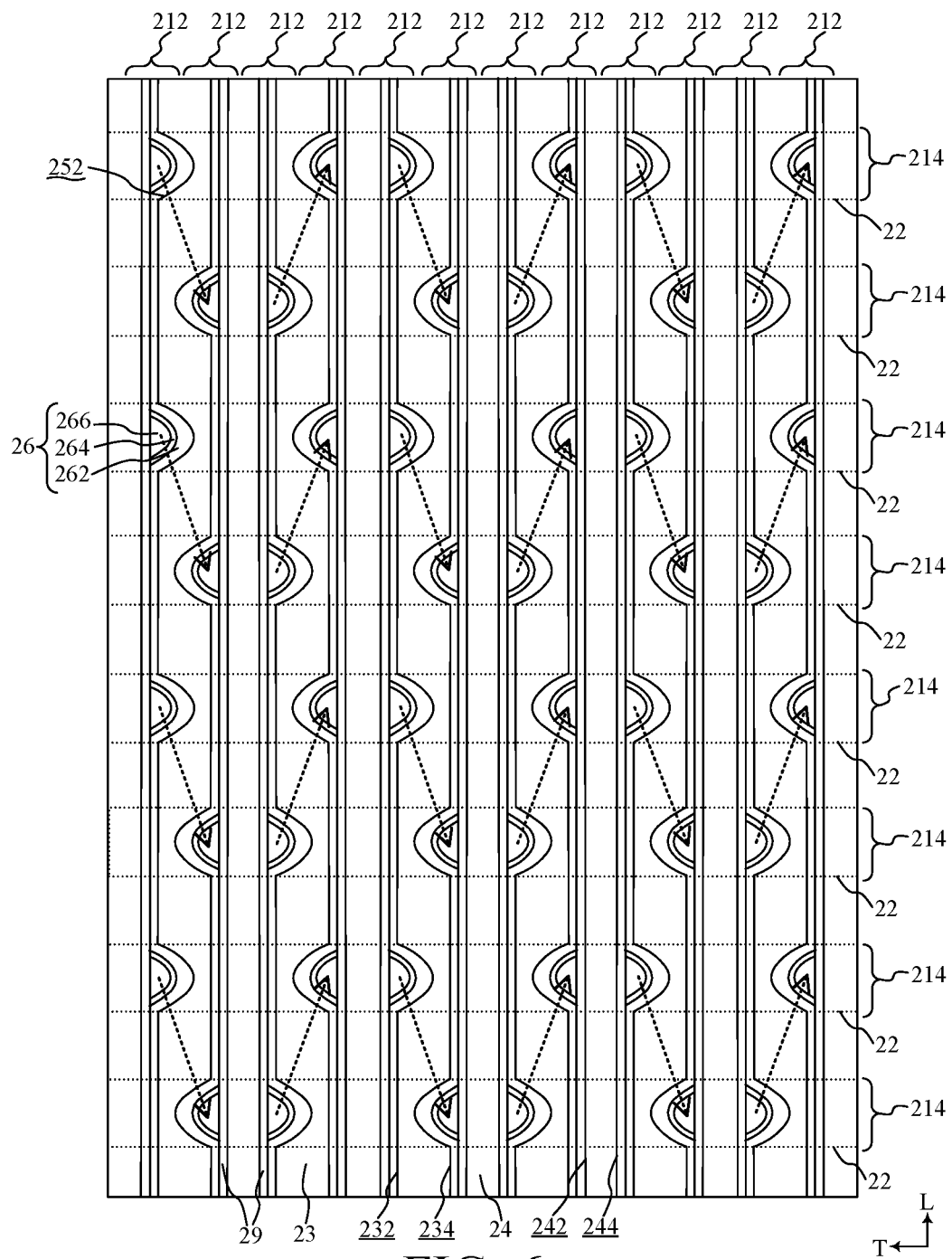
FIG. 6 is a top view of the NOR-type memory device according to the first preferred embodiment of the invention and removing top structures or elements.
Figure 7:
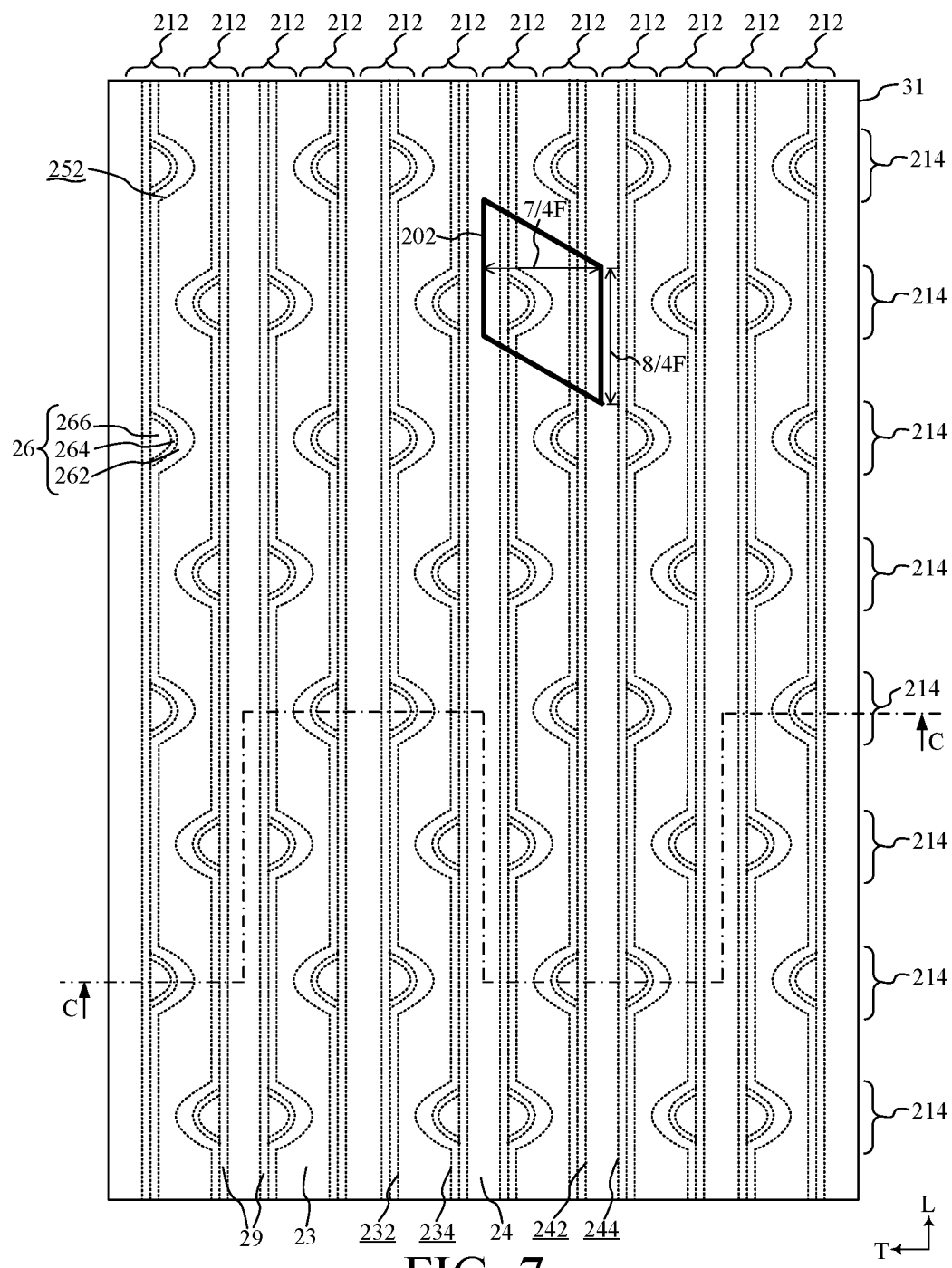
FIG. 7 is a top view of the NOR-type memory device according to the first preferred embodiment of the invention.
Figure 8:
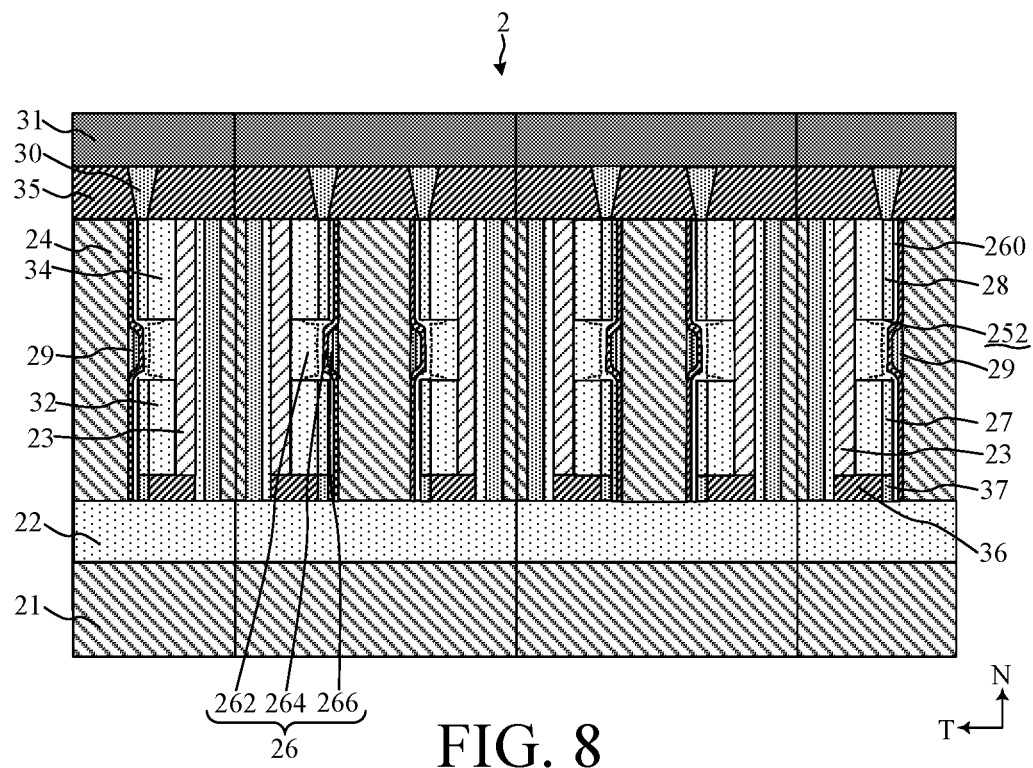
FIG. 8 is a cross-sectional schematic drawing of the NOR-type memory device according to the first preferred embodiment of the invention taken along the C-C line of FIG. 7.

Referring to FIG. 4, FIG. 5, FIG. 6, FIG. 7 and FIG. 8, those drawings schematically illustrate the NOR-type memory device 2 according to the first preferred embodiment of the invention. FIG. 4 is a perspective view schematically illustrating partial structure inside the NOR-type memory device 2 according to the first preferred embodiment of the invention. FIG. 5 is a cross-sectional view of a memory cell 26 of the NOR-type memory device 2 according to the first preferred embodiment of the invention taken along the B-B line of FIG. 4. FIG. 6 is a top view of the NOR-type memory device 2 according to the first preferred embodiment of the invention and removing top structures or elements. FIG. 7 is a top view of the NOR-type memory device 2 according to the first preferred embodiment of the invention. FIG. 8 is a cross-sectional schematic drawing of the NOR-type memory device 2 according to the first preferred embodiment of the invention taken along the C-C line of FIG. 7. The NOR-type memory device 2 according to the first preferred embodiment of the invention is mainly constituted by a plurality of transistors, i.e., memory cells, like that as shown in FIG. 1 and FIG. 2. Moreover, referring to FIG. 14, FIG. 14 is a cross-sectional schematic drawing of the semi-product of the NOR-type memory device 2 according to the invention during fabrication.

Figure 14:
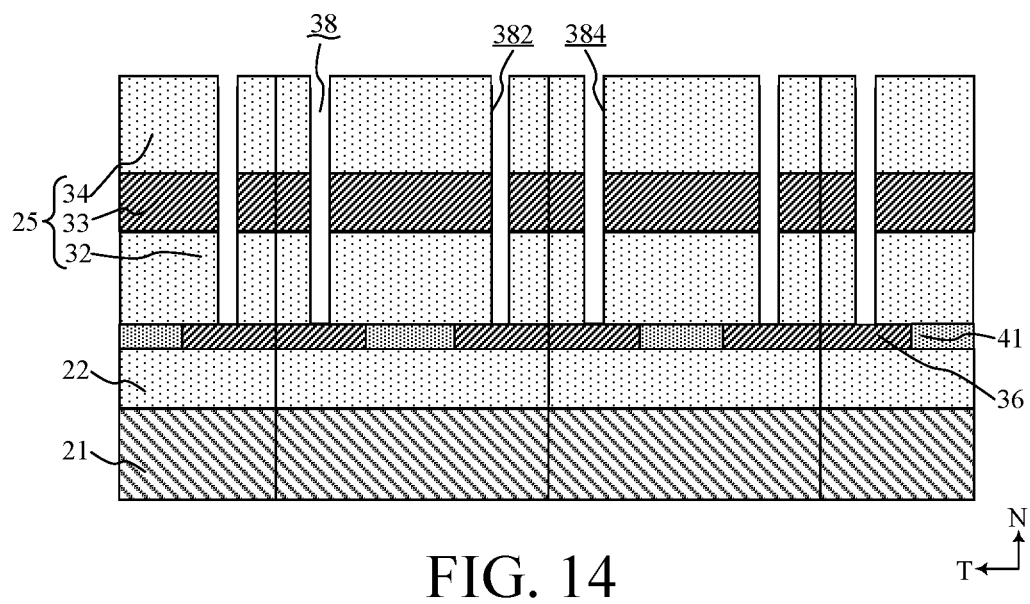
FIG. 14 is a cross-sectional schematic drawing of the semi-product of the NOR-type memory device taken along the F-F line of FIG. 13.

As shown in FIG. 4 to FIG. 8 and FIG. 14, the NOR-type memory device 2 according to the first preferred embodiment of the invention includes a semiconductor substrate 21, a plurality of bit lines 22, a plurality of first isolation stripes 23, a plurality of second isolation stripes 24, a plurality of multi-layer stripes 25 (as shown in FIG. 14), a plurality of memory cells 26, a plurality of first sub-bit lines 27, a plurality of second sub-bit lines 28, a plurality of word lines 29, a plurality of grounded via contacts 30, and a grounding layer 31. In FIG. 6, the dotted lines represent the plurality of bit lines 22 formed below the plurality of memory cells 26. In FIG. 7, the dashed lines represent the plurality of memory cells 26 formed below the grounding layer 31.

The semiconductor substrate 21 defines a longitudinal direction L, a transverse direction T, a normal direction N, a plurality of columns 212 in the longitudinal direction L, and a plurality of rows 214 in the transverse direction T.

In one embodiment, the semiconductor substrate 21 can be formed of sapphire, silicon, SiC, GaN, AlGaN, InGaN, ZnO, ScAlMgO$_4$, YSZ (yttria-stabilized zirconia), SrCu$_2$O$_2$, CuAlO$_2$, LaCuOS, NiO, LiGaO$_2$, LiAlO$_2$, GaAs, InP, or other semiconductor material.

The plurality of bit lines 22 are formed on the semiconductor substrate 21. Each bit line 22 corresponds to one of the rows 214, and extends along the corresponding row 214.

The plurality of first isolation stripes 23 are formed on the bit lines 22, and extend in the longitudinal direction L. Each first isolation stripe 23 has a respective first longitudinal edge 232 and a respective second longitudinal edge 234. The plurality of second isolation stripes 24 are formed on the bit lines 22, and extends in the longitudinal direction L. Each second isolation stripe 24 has a respective third longitudinal edge 242 and a respective fourth longitudinal edge 244. The first isolation stripes 23 and the second isolation stripes 24 are alternatingly arranged.

Also as shown in FIG. 14, the plurality of multi-layer stripes 25 are constituted by a first semiconductor layer 32 formed on the bit lines 22, a first insulating layer 33 formed on the first semiconductor layer 32 and a second semiconductor layer 34 formed on the first insulating layer 33. It is noted that the first insulating layer 33 exists during the manufacturing of the he NOR-type memory device 2 according to the first preferred embodiment of the invention, and that the first insulating layer 33 is completely removed after the NOR-type memory device 2 according to the first preferred embodiment of the invention is finished.

Each multi-layer stripe 25 corresponds to one of the first isolation stripes 23 and to one of the second isolation stripes 24. Each multi-layer stripe 25 is located between the corresponding first isolation stripe 23 and the corresponding second isolation stripe 24. Each multi-layer stripe 25 has a plurality of recesses 252 being formed at the first insulating layer 33 and facing the third longitudinal edge 242 or the fourth longitudinal edge 244 of the corresponding second isolation stripe 24. The recesses 252 at one side of each first isolation stripe 23 and the recesses 252 at the other side of said one first isolation stripe 23 are staggeredly arranged. Each recess 252 corresponds to one of the columns 212 and one of the rows 214.

Each memory cell 26 corresponds to one of the recesses 252, and includes a respective pillar 262 of a semiconductor material 260. Each pillar 262 of the semiconductor material 260 is fitted in the corresponding recess 252, and extends in the transverse direction T of the semiconductor substrate 21. Each pillar 262 of the semiconductor material 260 has a respective base side face 2620 parallel to the normal direction N, a respective tapered side face 2621 opposite to the base side face 2620, a respective first top face 2622 perpendicular to the normal direction N, a respective bottom face 2623 opposite to the first top face 2622, a respective front side face 2624 adjacent to the base side face 2620 and the tapered side face 2621, and a respective rear side face 2625 opposite to the front side face 2624. Each pillar 262 of the semiconductor material 260 also has a respective first elongated portion 2626 sandwiched among the first top face 2622, the base side face 2620, the front side face 2624 and the rear side face 2625 forming a respective source region SR. Each pillar 262 of the semiconductor material 260 also has a respective second elongated portion 2627 sandwiched among the bottom face 2623, the base side face 2620, the front side face 2624 and the rear side face 2625 forming a respective drain region DR. Each pillar 262 of the semiconductor material 260 also has a respective plate portion 2628 on the base side face 2620 and between the first elongated portion 2626, the second elongated portion 2627 forming a respective channel region CR, and other portion of the pillar 262 forming a respective body region. In practical, the semiconductor material 260 may be also overlaid on the first longitudinal edges 232 and the second longitudinal edges 234 of the first isolation stripes 23.

In some embodiments, the semiconductor material 260 forming the pillar 262 can be, for example, polysilicon. The source region SR and the drain region DR can be doped with an n-type dopant (e.g., phosphorus or arsenic) or a p-type dopant (e.g., boron). The channel region CR can be doped with a dopant of a different conductivity from the source region SR and the drain region DR. A portion of the body region that is away from the channel region CR, the source region SR and the drain region DR can be optionally doped with the specific dopant.

Each memory cell 26 also includes a respective gate oxide (i.e., tunneling oxide)/gate dielectric multi-layer 264 overlaying the base side face 2620 of the corresponding pillar 262 of the semiconductor material 260 and a respective gate conductor 266 overlaying the gate oxide/gate dielectric multi-layer 264. Each first sub-bit line 27 is formed at the first semiconductor layer 32, and corresponds to one of the memory cells 26 and to one of the bit lines 22. Each first sub-bit line 27 connects between the drain region DR of the corresponding memory cell 26 and the corresponding bit line 22. Each second sub-bit line 28 is formed at the second semiconductor layer 34, and corresponds to one of the memory cells 26. Each second sub-bit line 28 connects the source region SR of the corresponding memory cell 26.

Each of the word lines 29 corresponds to one of the columns 212, and connects the gate conductors 266 along the corresponding column 212.

The NOR-type memory device 2 according to the first preferred embodiment of the invention also includes a second insulating layer 35. The second insulating layer 35 is formed on the second semiconductor layer 34, the first isolation stripes 23 and the second isolation stripes 24. Each of the grounded via contacts 30 corresponds to one of the second sub-bit lines 28, and is formed through the second insulating layer 35 to connect the corresponding second sub-bit line 28. The grounding layer 31 is formed on the second insulating layer 35 to connect all of the grounded via contacts 30.

In one embodiment, the base side face 2620 can be planar, convex or concave.

In one embodiment, in each memory cell 26, a combination of the first top face 2622 of the pillar 262 of the semiconductor material 260, a second top face of the gate oxide/gate dielectric multi-layer 264 and a third top face of the gate conductor 266 can exhibit a semi-ellipse, a semi-circle, a triangle, a finger-like shape or a trapezoid.

Further, the NOR-type memory device 2 according to the first preferred embodiment of the invention also includes a third insulating layer 36 and a plurality of connection lines 37. The third insulating layer 36 is formed to overlay the semiconductor substrate 21 and the bit lines 22, and is formed between the first isolation stripes 23, the second isolation stripes 24 and the bit lines 22. Each of the connection lines 37 corresponds to one of the first sub-bit lines 27 and to one of the bit lines 22, and is formed through the third insulating layer 36 to connect between the corresponding first sub-bit lines 27 and the corresponding bit line 22. The connection lines 37 specify stable current density and direction.

Also as shown in FIG. 7, each memory cell block 202 is encircled in a bold line parallelogram with a side length of 2F where F represents the process feature size (i.e., the minimum lithographic feature size). By the bold line parallelogram, the cell size of the NOR-type memory device 2 according to the first preferred embodiment of the invention is calculated by the following formula:

cell size=8/4$F$×7/4$F$=3.5$F^2$

Therefore, on theory, a cell size of the NOR-type memory device according to the first preferred embodiment of the invention is equal to 3.5 times a square of a process feature size.

Referring to FIGS. 9 through 20, those drawings schematically illustrate a method, according to the second preferred embodiment of the invention, of fabrication a NOR-type memory device 2 as shown in FIG. 4 to FIG. 8.

Figure 9:
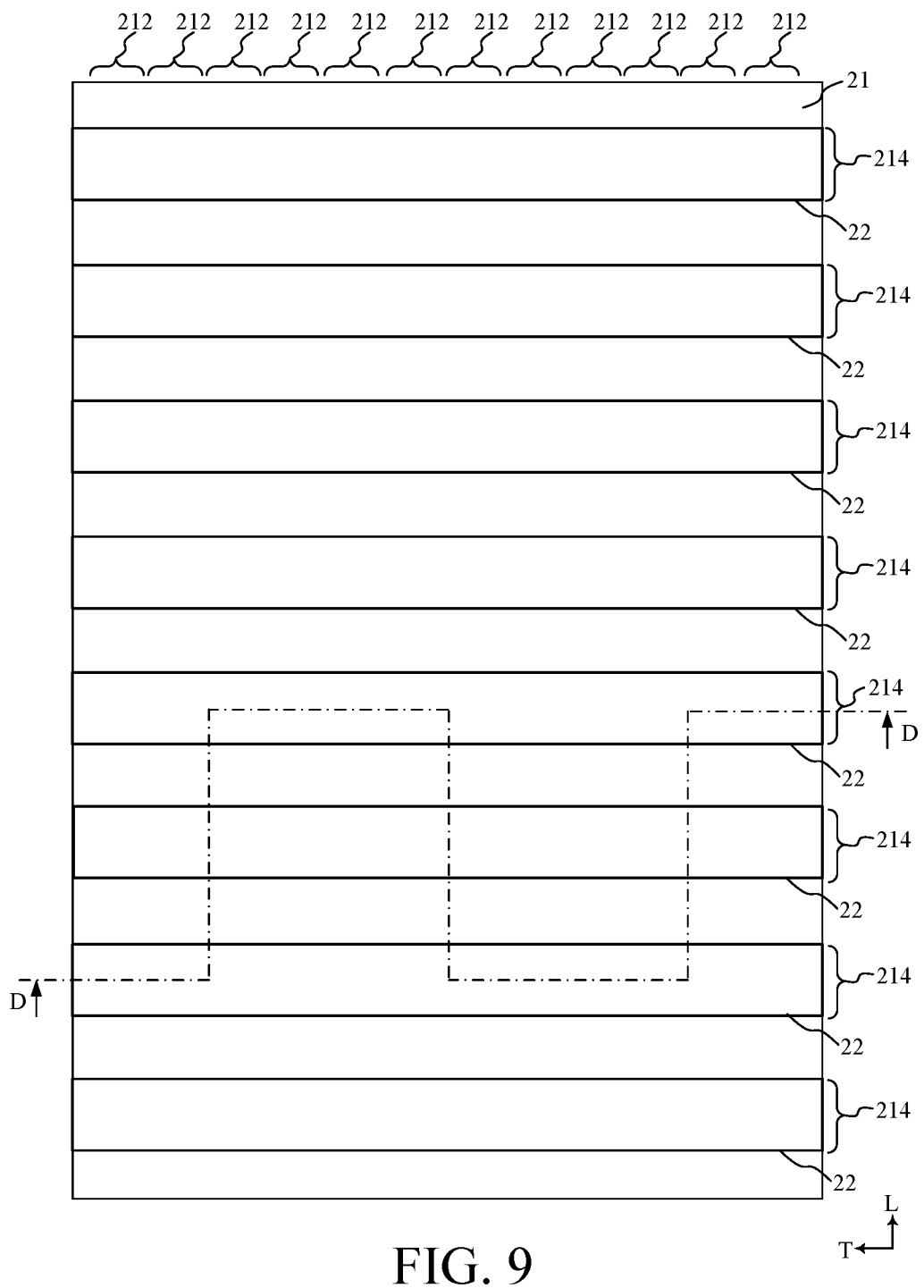
FIG. 9 is a top view of a semi-product of the NOR-type memory device fabricated by the method according to the second preferred embodiment of the invention.
Figure 10:
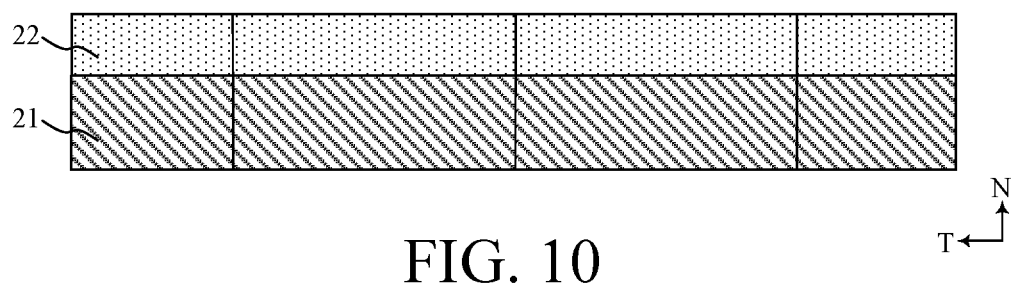
FIG. 10 is a cross-sectional schematic drawing of the semi-product of the NOR-type memory device taken along the D-D line of FIG. 9.

Referring to FIG. 9 and FIG. 10, FIG. 9 is a top view of a semi-product of the NOR-type memory device 2 fabricated by the method according to the second preferred embodiment of the invention. FIG. 10 is a cross-sectional schematic drawing of the semi-product of the NOR-type memory device 2 taken along the D-D line of FIG. 9. As shown in FIG. 9 and FIG. 10, the method according to the second preferred embodiment of the invention, firstly, is to form a plurality of bit lines 22 on a semiconductor substrate 21, where the semiconductor substrate 21 defines a longitudinal direction L, a transverse direction T, a normal direction N, a plurality of columns 212 in the longitudinal direction L, and a plurality of rows 214 in the transverse direction T. Each bit line 22 corresponds to one of the rows 214, and extends along the corresponding row 214.

Figure 11:
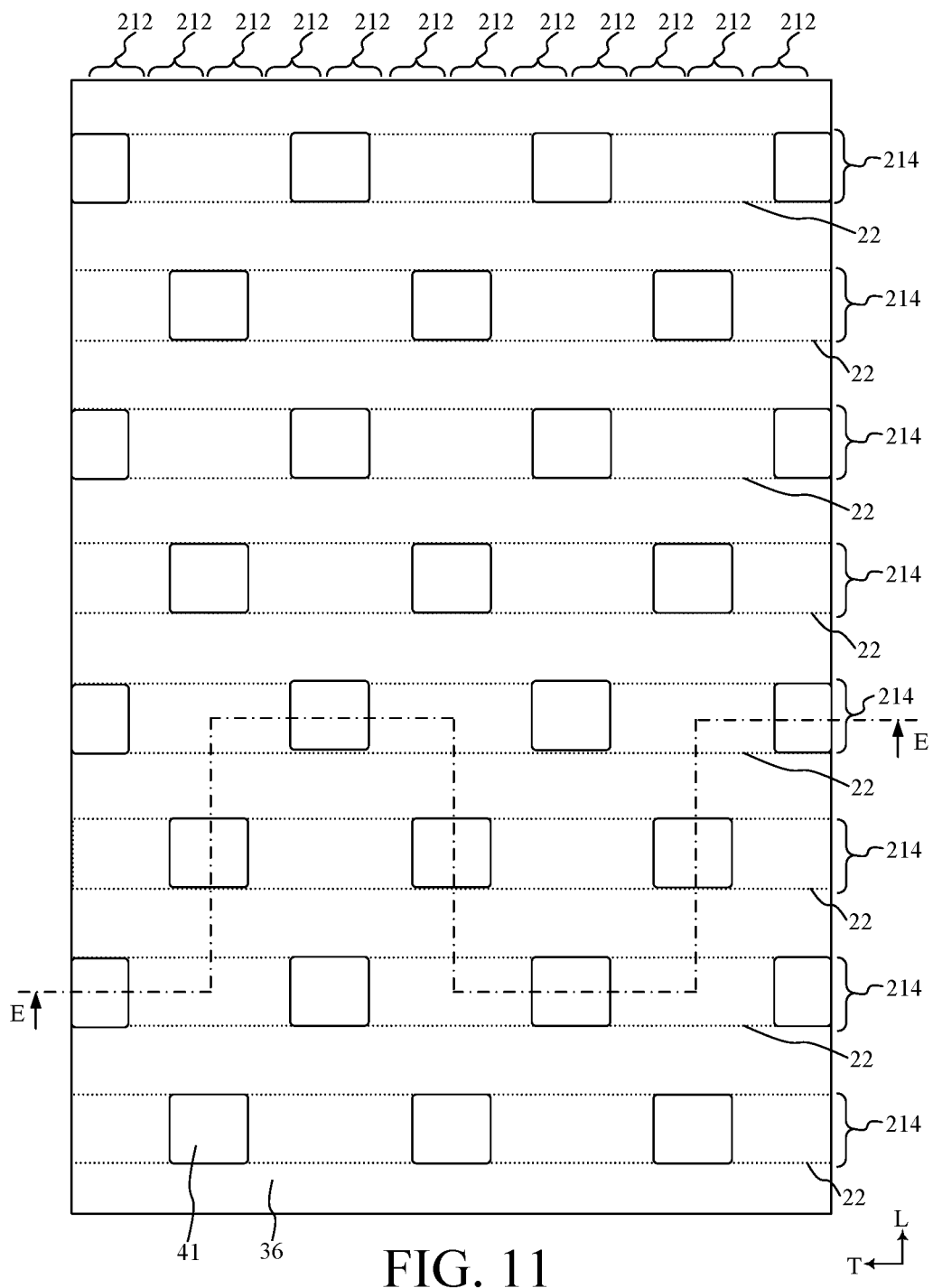
FIG. 11 is another top view of the semi-product of the NOR-type memory device fabricated by the method according to the second preferred embodiment of the invention.
Figure 12:
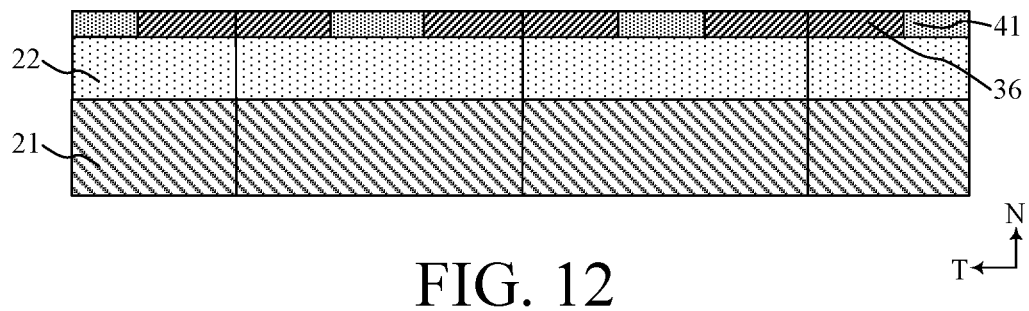
FIG. 12 is a cross-sectional schematic drawing of the semi-product of the NOR-type memory device taken along the E-E line of FIG. 11.

Referring to FIG. 11 and FIG. 12, FIG. 11 is another top view of the semi-product of the NOR-type memory device 2 fabricated by the method according to the second preferred embodiment of the invention. FIG. 12 is a cross-sectional schematic drawing of the semi-product of the NOR-type memory device 2 taken along the E-E line of FIG. 11. As shown in FIG. 11 and FIG. 12, subsequently, the method according to the second preferred embodiment of the invention is to form a third insulating layer 36 to overlay the semiconductor substrate 21 and the bit lines 22. Also as shown in FIG. 11 and FIG. 12, next, the method according to the second preferred embodiment of the invention is to form a plurality of conductive pads 41 which each corresponds to one of the rows 214 and two of the columns 212 and is formed at the corresponding row 214 and the correspond two columns 212 and through the third insulating layer 36 to contact the bit line 22 along the corresponding row 214.

Figure 13:
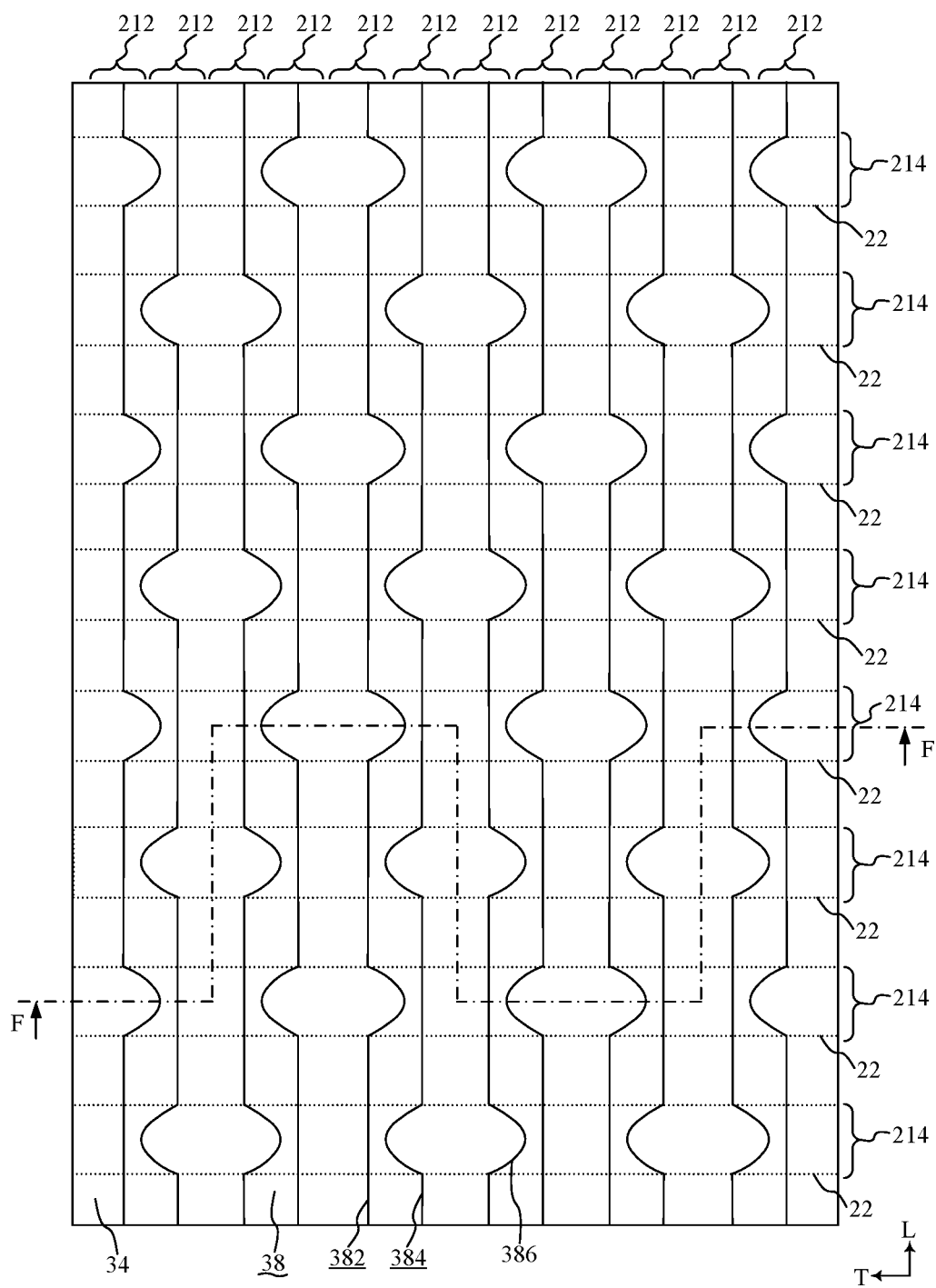
FIG. 13 is another top view of the semi-product of the NOR-type memory device fabricated by the method according to the second preferred embodiment of the invention.

Referring to FIG. 13 and referring to FIG. 14 again, FIG. 13 is another top view of the semi-product of the NOR-type memory device 2 fabricated by the method according to the second preferred embodiment of the invention. FIG. 14 is a cross-sectional schematic drawing of the semi-product of the NOR-type memory device 2 taken along the F-F line of FIG. 13. As shown in FIG. 13 and FIG. 14, next, the method according to the second preferred embodiment of the invention is to form a first semiconductor layer 32 to overlay the third insulating layer 36. Also as shown in FIG. 13 and FIG. 14, then, the method according to the second preferred embodiment of the invention is to form a first insulating layer 33 on the first semiconductor layer 32. Also as shown in FIG. 13 and FIG. 14, subsequently, the method according to the second preferred embodiment of the invention is to form a second semiconductor layer 34 on the first insulating layer 33. Also as shown in FIG. 13 and FIG. 14, afterward, the method according to the second preferred embodiment of the invention is to form a plurality of first trenches 38 parallel to the longitudinal direction L and through the first semiconductor layer 32, the first insulating layer 33 and the second semiconductor layer 34, where each first trench 38 has a respective first longitudinal side wall 382, a respective second longitudinal side wall 384 and a plurality of protrusions 386 protruding inwardly. The protrusions 386 on the first longitudinal side wall 382 and the protrusions 386 on the second longitudinal side wall 384 are staggeredly arranged.

Figure 15:
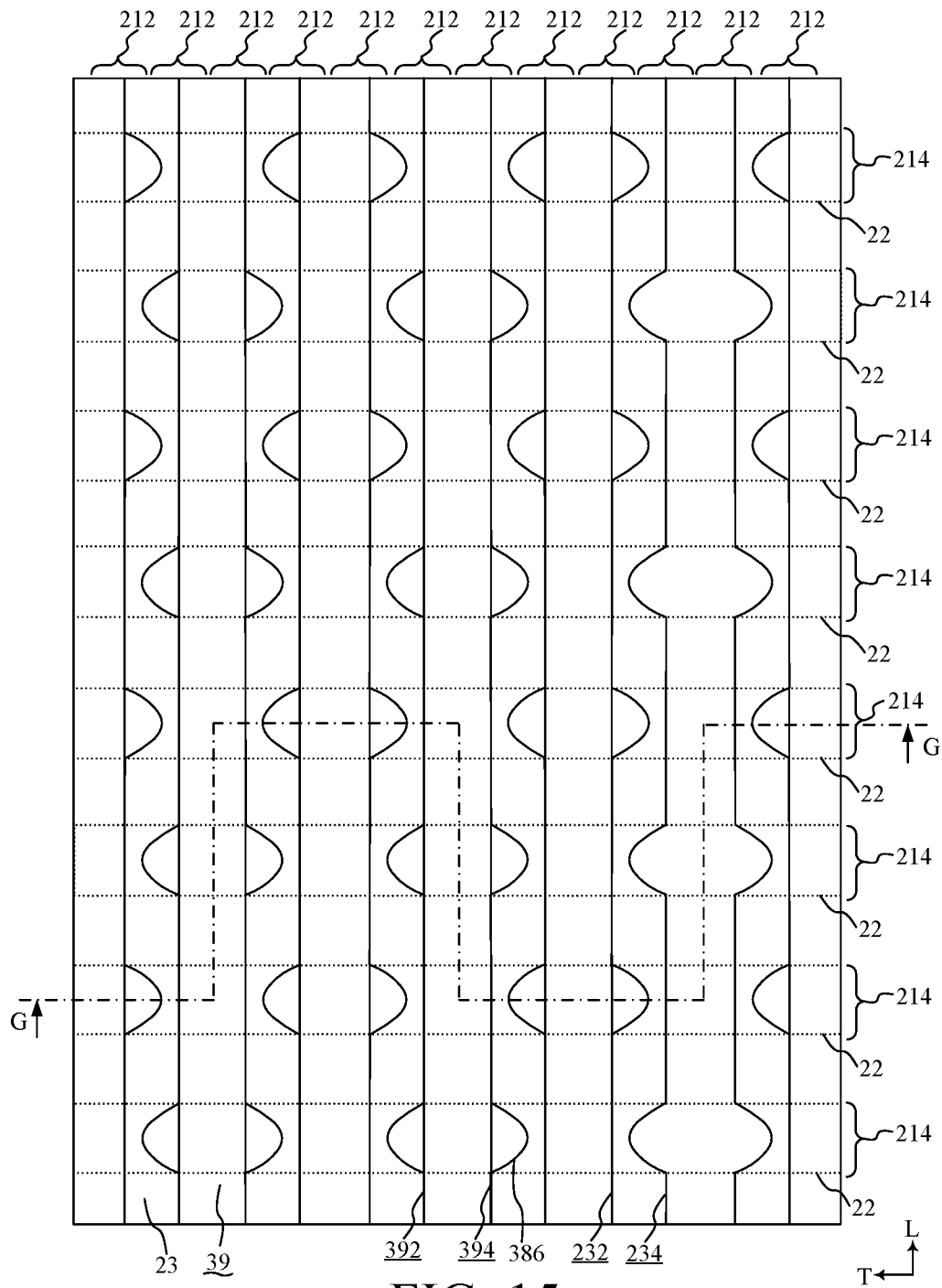
FIG. 15 is another top view of the semi-product of the NOR-type memory device fabricated by the method according to the second preferred embodiment of the invention.
Figure 16:
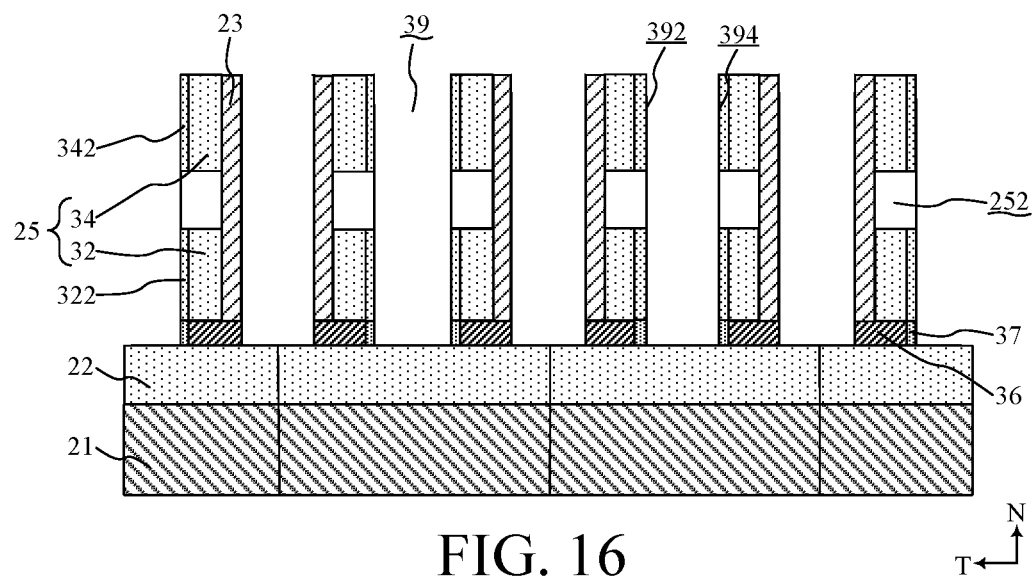
FIG. 16 is a cross-sectional schematic drawing of the semi-product of the NOR-type memory device taken along the G-G line of FIG. 15.

Referring to FIG. 15 and FIG. 16, FIG. 15 is another top view of the semi-product of the NOR-type memory device 2 fabricated by the method according to the second preferred embodiment of the invention. FIG. 16 is a cross-sectional schematic drawing of the semi-product of the NOR-type memory device 2 taken along the G-G line of FIG. 15. As shown in FIG. 15 and FIG. 16, next, the method according to the second preferred embodiment of the invention is to form a plurality of first isolation stripes 23 which each is filled in one of the first trenches 38 such that a plurality of multi-layer stripes 25 of the first semiconductor layer 32, the first insulating layer 33 and the second semiconductor layer 34 and the first isolation stripes 23 are alternately arranged. Each first isolation stripe 23 has a respective first longitudinal edge 232 and a respective second longitudinal edge 234.

Also as shown in FIG. 15 and FIG. 16, then, the method according to the second preferred embodiment of the invention is to form a plurality of second trenches 39 parallel to the longitudinal direction L, where each second trench 39 is formed on a portion of one of the multi-layer stripes 25 and through the first semiconductor layer 32, the first insulating layer 33 and the second semiconductor layer 34, and has a respective third longitudinal side wall 392 and a respective fourth longitudinal side wall 394.

Also as shown in FIG. 15 and FIG. 16, subsequently, the method according to the second preferred embodiment of the invention is to partially dope the first semiconductor layer 32 and the second semiconductor layer 34 on the third longitudinal side wall 392 and the fourth longitudinal side wall 394 of each second trench 39 to form a plurality of first conductive portions 322 on the first semiconductor layer 32 and a plurality of second conductive portions 342 on the second semiconductor layer 34, where each first conductive portion 322 and each second conductive portion 342 correspond to one of the protrusions 386.

Also as shown in FIG. 15 and FIG. 16, afterward, the method according to the second preferred embodiment of the invention is to remove a plurality of retained portions of the first insulating layer 33 which each corresponds to one of the protrusions 386 such that a plurality of recesses 252 are formed on the third longitudinal side walls 392 and the fourth longitudinal side walls 394 of the second trenches 39, where the recesses 252 at one side of each first isolation stripe 23 and the recesses 252 at the other side of said one first isolation stripe 23 are staggeredly arranged. Each recess 252 corresponds to one of the columns 212 and one of the rows 214.

Figure 17:
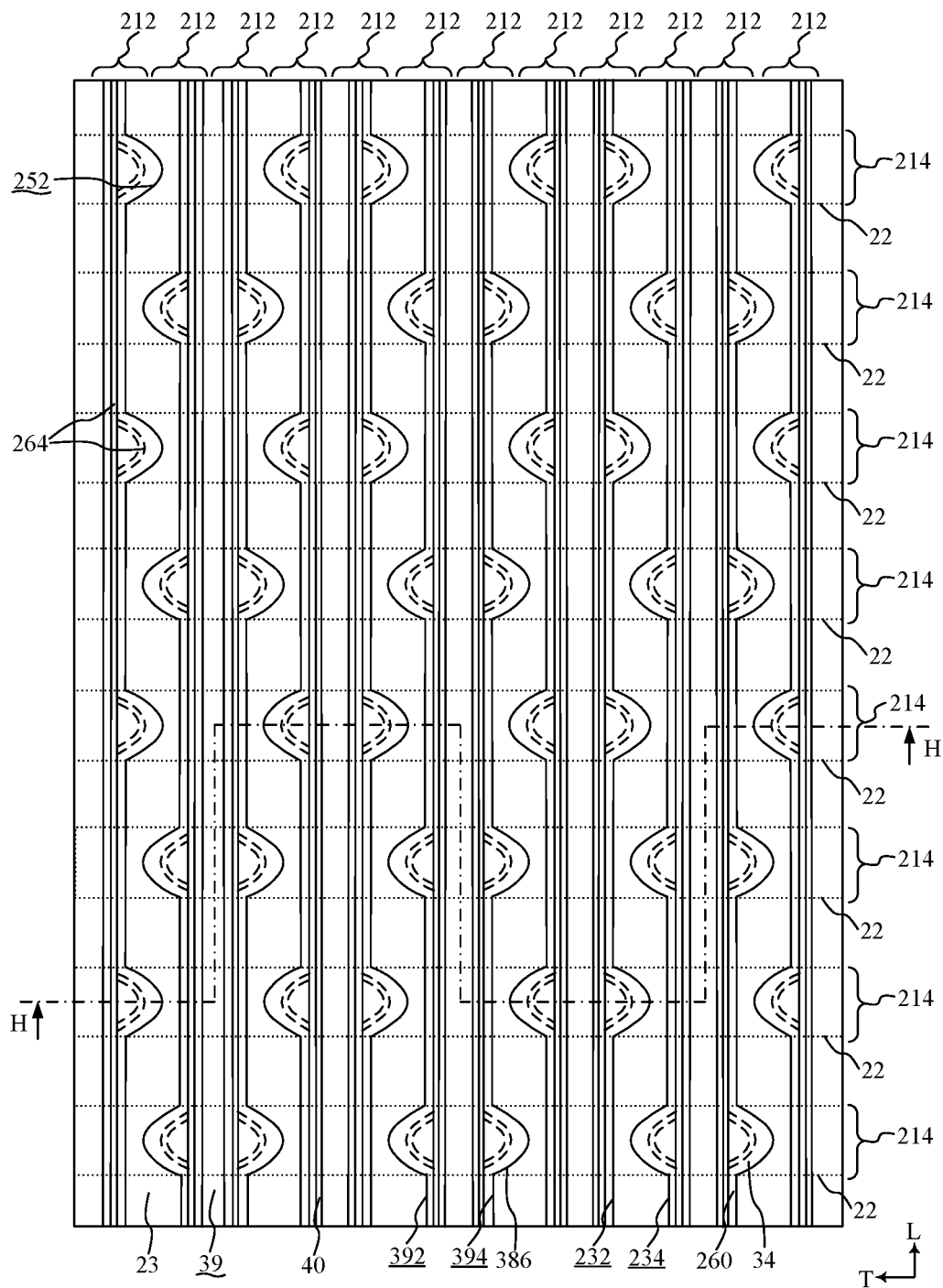
FIG. 17 is another top view of the semi-product of the NOR-type memory device fabricated by the method according to the second preferred embodiment of the invention.
Figure 18:
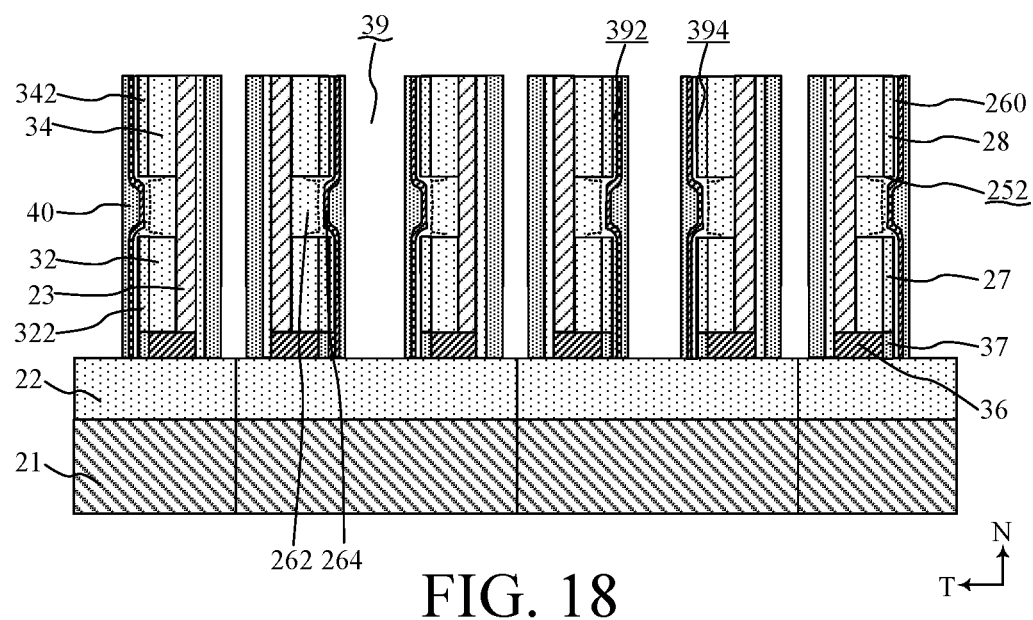
FIG. 18 is a cross-sectional schematic drawing of the semi-product of the NOR-type memory device taken along the H-H line of FIG. 17.

Referring to FIG. 17 and FIG. 18, FIG. 17 is another top view of the semi-product of the NOR-type memory device 2 fabricated by the method according to the second preferred embodiment of the invention. FIG. 18 is a cross-sectional schematic drawing of the semi-product of the NOR-type memory device 2 taken along the H-H line of FIG. 17. As shown in FIG. 17 and FIG. 18, next, the method according to the second preferred embodiment of the invention is to form a plurality of pillars 262 of a semiconductor material 260, where the pillars 262 of the semiconductor material 260 are arranged in the columns 212 and the rows 214. In order to easily manufacture, the semiconductor material 260 forming the pillars 262 can also overlay the first conductive portions 322 and the second conductive portions 342.

Referring to FIG. 4 and FIG. 5 again, each pillar 262 of the semiconductor material 260 is fitted in one of the recesses 252, and extends in the transverse direction T of the semiconductor substrate 21. Each pillar 262 of the semiconductor material 260 has a respective base side face 2620 parallel to the normal direction N, a respective tapered side face 2621 opposite to the base side face 2620, a respective first top face 2622 perpendicular to the normal direction N, a respective bottom face 2623 opposite to the first top face 2622, a respective front side face 2624 adjacent to the base side face 2620 and the tapered side face 2621, and a respective rear side face 2625 opposite to the front side face 2624. Each pillar 262 of the semiconductor material 260 also has a respective first elongated portion 2626 sandwiched among the first top face 2622, the base side face 2620, the front side face 2624 and the rear side face 2625 to form a respective source region SR, a respective second elongated portion 2627 sandwiched among the bottom face 2623, the base side face 2620, the front side face 2624 and the rear side face 2625 to form a respective drain region DR, a respective plate portion 2628 on the base side face 2620 and between the first elongated portion 2626 and the second elongated portion 2627 to form a respective channel region CR, and other portion of the pillar 262 of the semiconductor material 260 to form a respective body region. In practical, the semiconductor material 260 may be also overlaid on the third longitudinal side walls 392 and the fourth longitudinal side walls 394 of the second trenches 39.

Each of the first conductive portions 322 serves as one of a plurality of first sub-bit lines 27 which each correspond to one of the pillars 262 and to one of the bit lines 22 and connects between the drain region DR of the corresponding pillar 262 and the corresponding bit line 22. Each of the second conductive portions 342 serves as one of a plurality of second sub-bit lines 28 which each corresponds to one of the pillars 262 and connects the source region SR of the corresponding pillar 262.

Also as shown FIG. 17 and FIG. 18, then, the method according to the second preferred embodiment of the invention is to form a plurality of gate oxide (i.e., tunneling oxide)/gate dielectric multi-layers 264 which each overlays the base side face 2620 of one of the pillars 262 of the semiconductor material 260. In order to easily manufacture, the gate oxide/gate dielectric multi-layers 264 can also overlay the semiconductor material 260 overlaying the first conductive portions 322 and the second conductive portions 342.

Also as shown FIG. 17 and FIG. 18, subsequently, the method according to the second preferred embodiment of the invention is to form a plurality of conductor layers 40 which each overlays one of the third longitudinal side wall 392 and the fourth longitudinal side wall 394 of one of the second trenches 39. In practical, each of the conductor layers 40 may be also overlaid on one of the gate oxide/gate dielectric multi-layers 264 and the semiconductor material 260.

Figure 19:
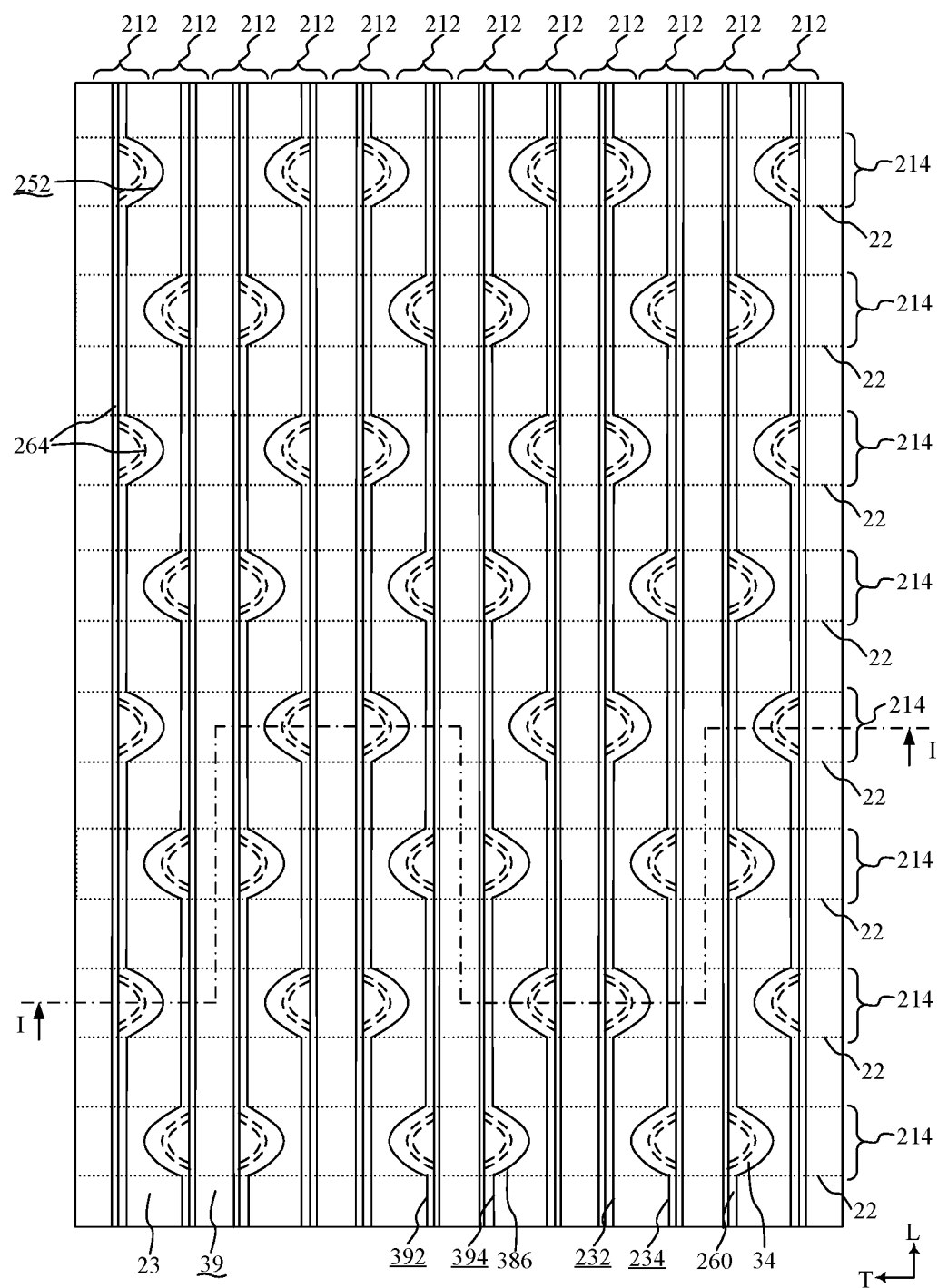
FIG. 19 is another top view of the semi-product of the NOR-type memory device fabricated by the method according to the second preferred embodiment of the invention.
Figure 20:
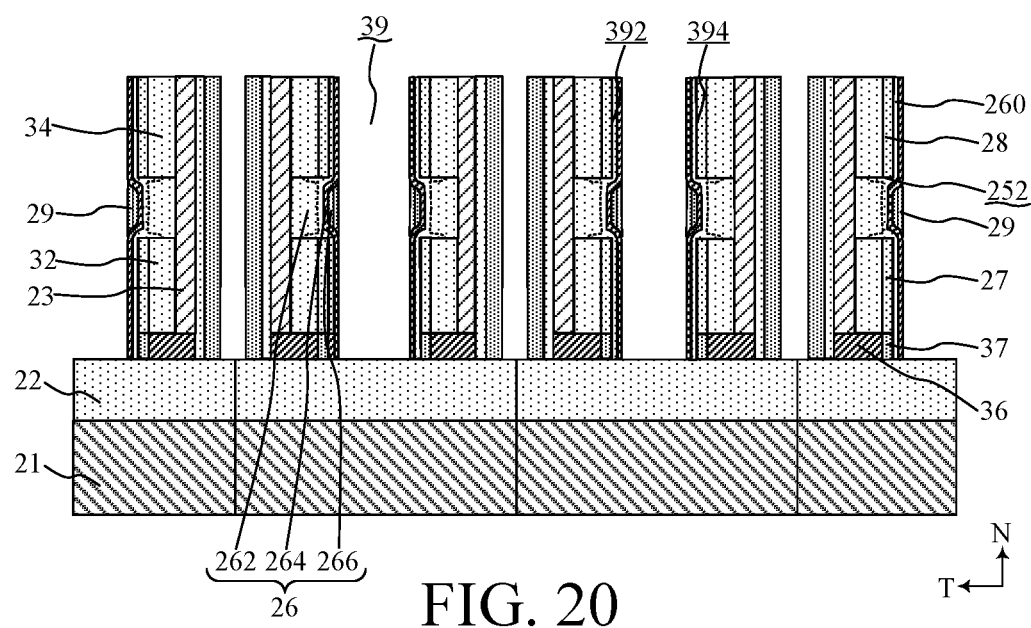
FIG. 20 is a cross-sectional schematic drawing of the semi-product of the NOR-type memory device taken along the I-I line of FIG. 19.

Referring to FIG. 19 and FIG. 20, FIG. 19 is another top view of the semi-product of the NOR-type memory device 2 fabricated by the method according to the second preferred embodiment of the invention. FIG. 20 is a cross-sectional schematic drawing of the semi-product of the NOR-type memory device 2 taken along the I-I line of FIG. 19. As shown in FIG. 19 and FIG. 20, afterward, the method according to the second preferred embodiment of the invention is to partially etch the conductor layers 40 to form a plurality of gate conductors 266 and a plurality of word lines 29, where each gate conductor 266 overlays one of the gate oxide/gate dielectric multi-layers 264, each word line 29 corresponds to one of the columns 212 and connects the gate conductors 266 along the corresponding column 212. In order to increase the volume of the gate conductors 266 and the word lines 29, another semiconductor material (not shown in FIG. 18 and FIG. 20) can overlay the gate oxide/gate dielectric multi-layers 264 overlaying the semiconductor material 260 overlaying the first conductive portions 322 and the second conductive portions 342 before the formation of the conductor layers 40.

It is noted that the portions of the conductive pads 41 within the second trenches 39 are removed to change the conductive pads 41 into a plurality of connection lines 37 which each corresponds to one of the first sub-bit lines 27 and to one of the bit lines 22 and connects between the corresponding first sub-bit lines 27 and the corresponding bit line 22.

Figure 21:
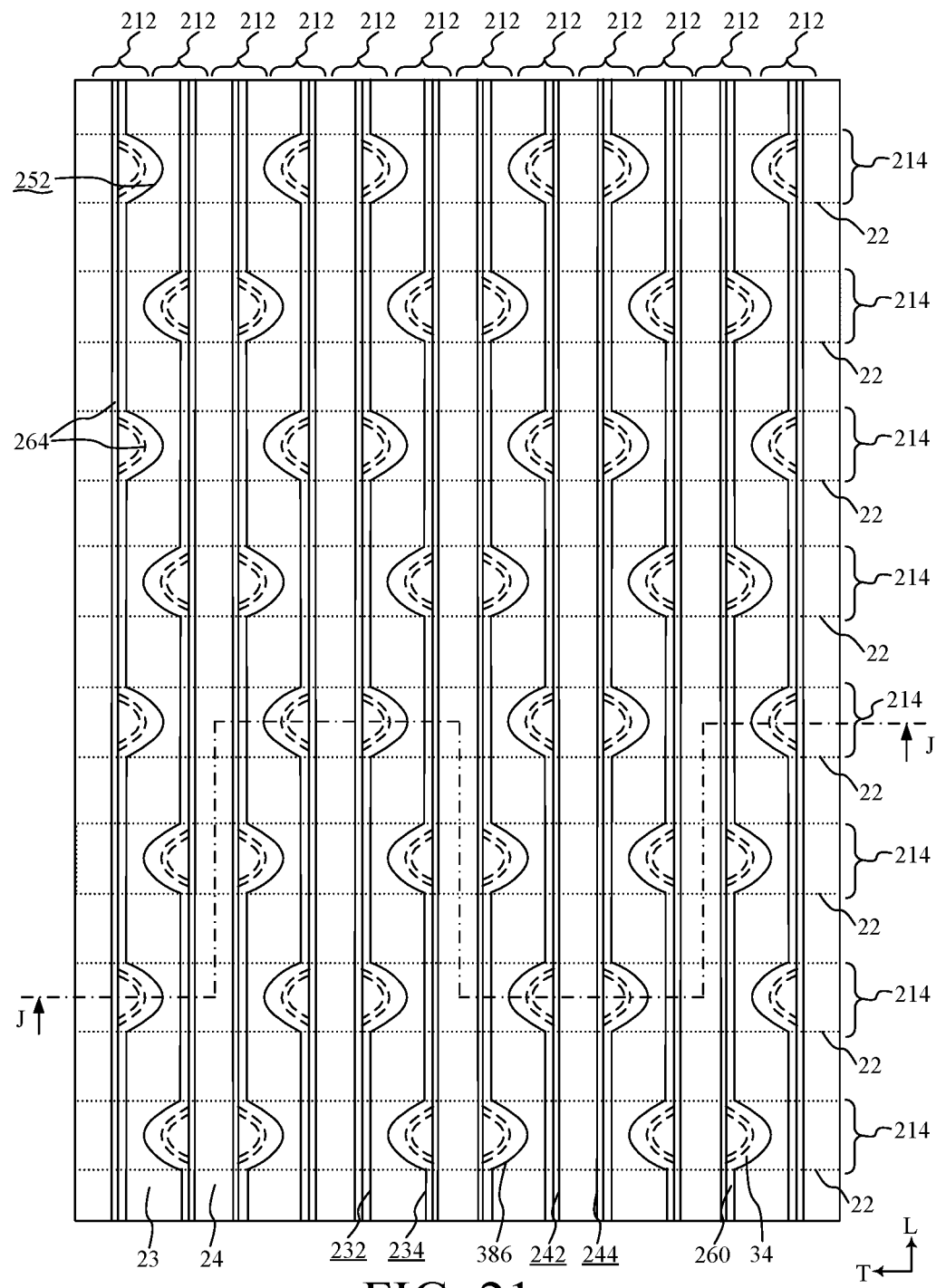
FIG. 21 is another top view of the semi-product of the NOR-type memory device fabricated by the method according to the second preferred embodiment of the invention.
Figure 22:
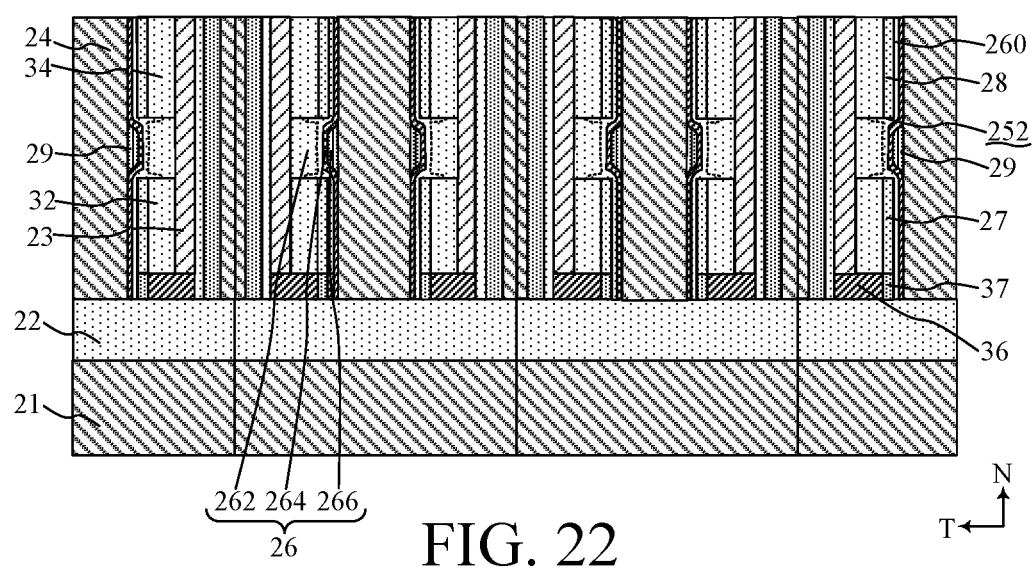
FIG. 22 is a cross-sectional schematic drawing of the semi-product of the NOR-type memory device taken along the J-J line of FIG. 21.

Referring to FIG. 21 and FIG. 22, FIG. 21 is another top view of the semi-product of the NOR-type memory device 2 fabricated by the method according to the second preferred embodiment of the invention. FIG. 22 is a cross-sectional schematic drawing of the semi-product of the NOR-type memory device 2 taken along the J-J line of FIG. 21. As shown in FIG. 21 and FIG. 22, next, the method according to the second preferred embodiment of the invention is to form a plurality of second isolation stripes 24 which each is filled in one of the second trenches 39.

Referring to FIG. 7 and FIG. 8 again, then, the method according to the second preferred embodiment of the invention is to form a second insulating layer 35 on the second semiconductor layer 34, the first isolation stripes 23 and the second isolation stripes 24. Also as shown in FIG. 7 and FIG. 8, subsequently, the method according to the second preferred embodiment of the invention is to form a plurality of grounded via contacts 30 which each corresponds to one of the second sub-bit lines 28 and is formed through the second insulating layer 35 to connect the corresponding second sub-bit line 28. Also as shown in FIG. 7 and FIG. 8, finally, the method according to the second preferred embodiment of the invention is to form a grounding layer 31 on the second insulating layer 35 to connect all of the grounded via contacts 30.

Figure 23:
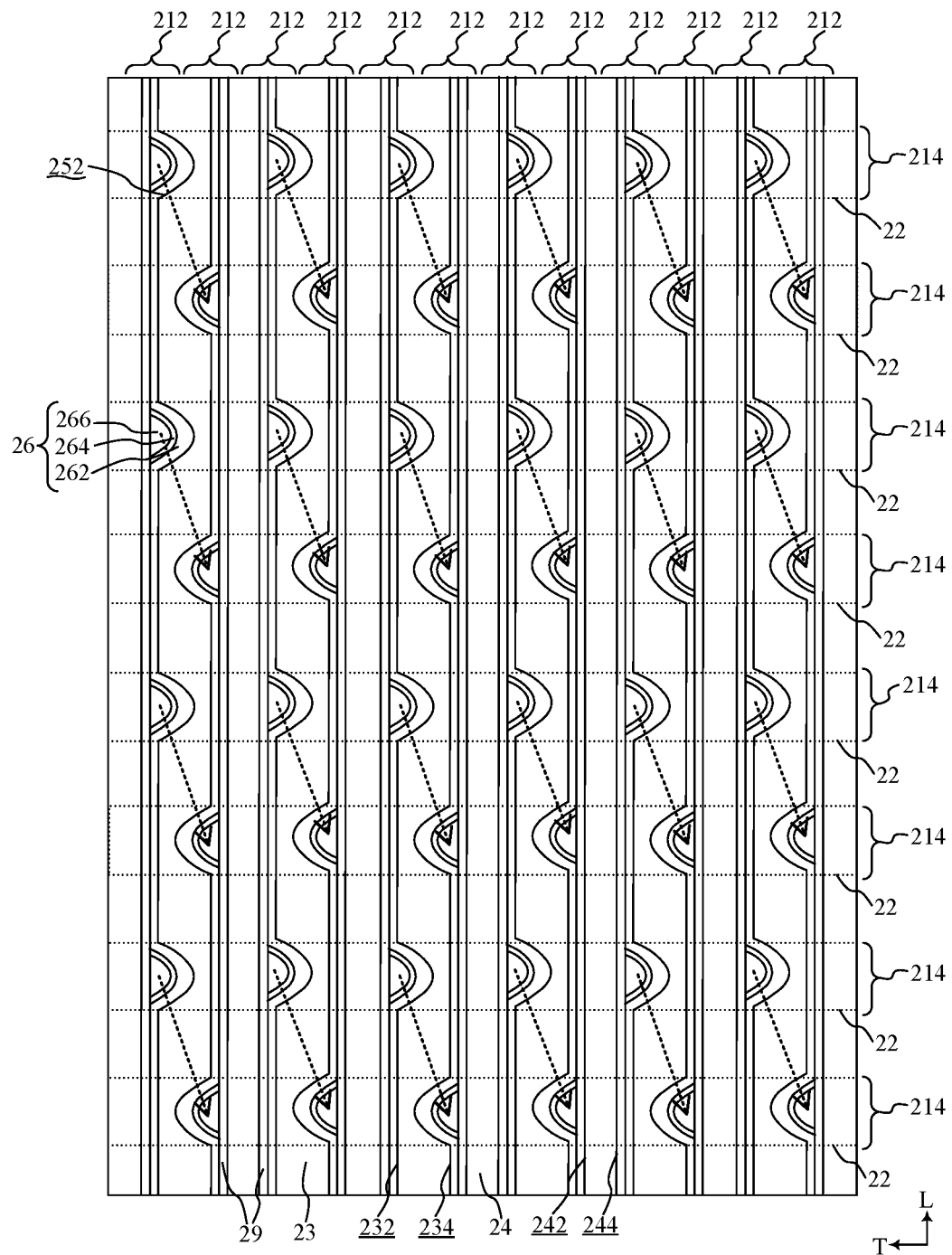
FIG. 23 is a top view of a modification of the NOR-type memory device according to the first preferred embodiment of the invention and removing top structures or elements.
Figure 24:
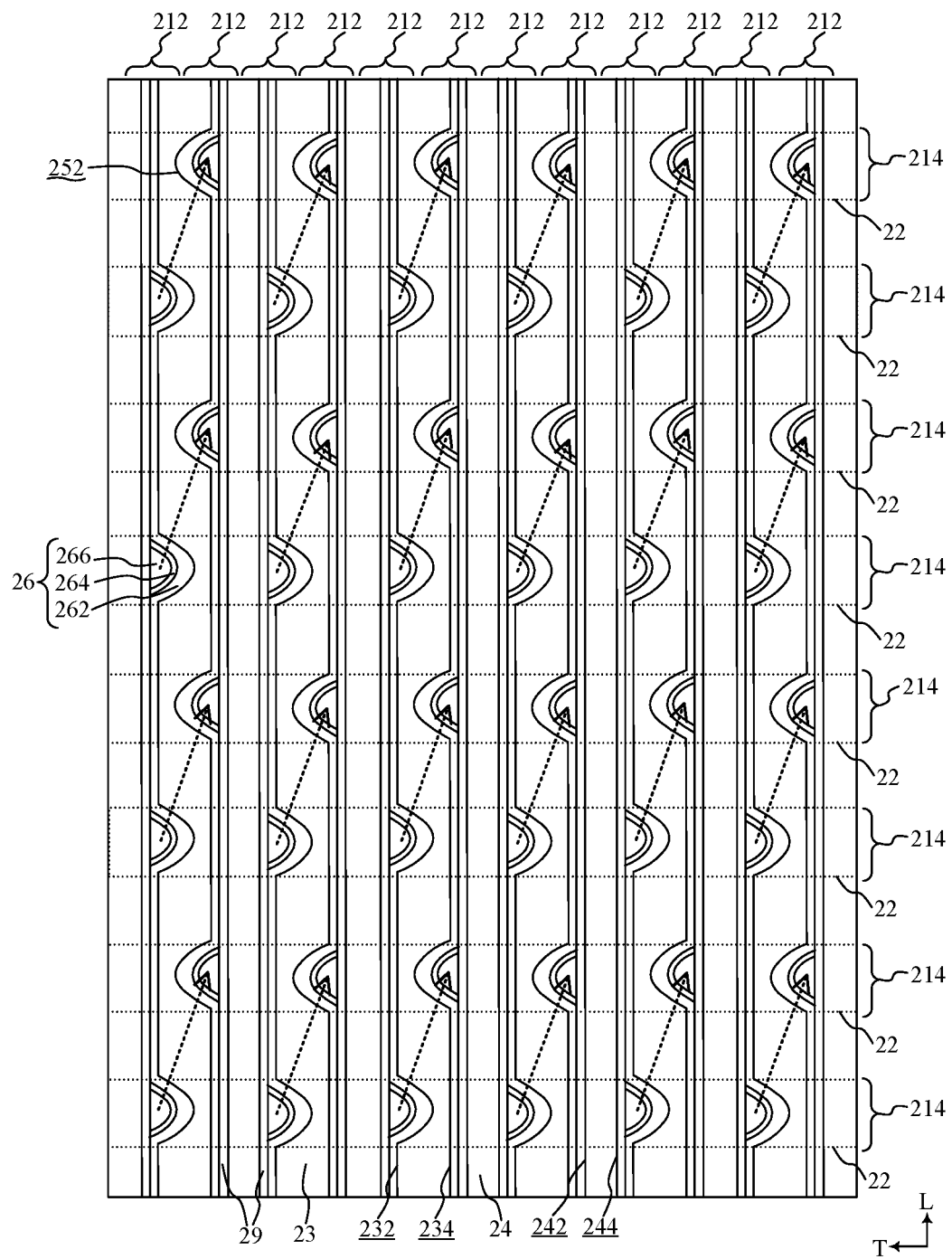
FIG. 24 is a top view of another modification of the NOR-type memory device according to the first preferred embodiment of the invention and removing top structures or elements.
Figure 25:
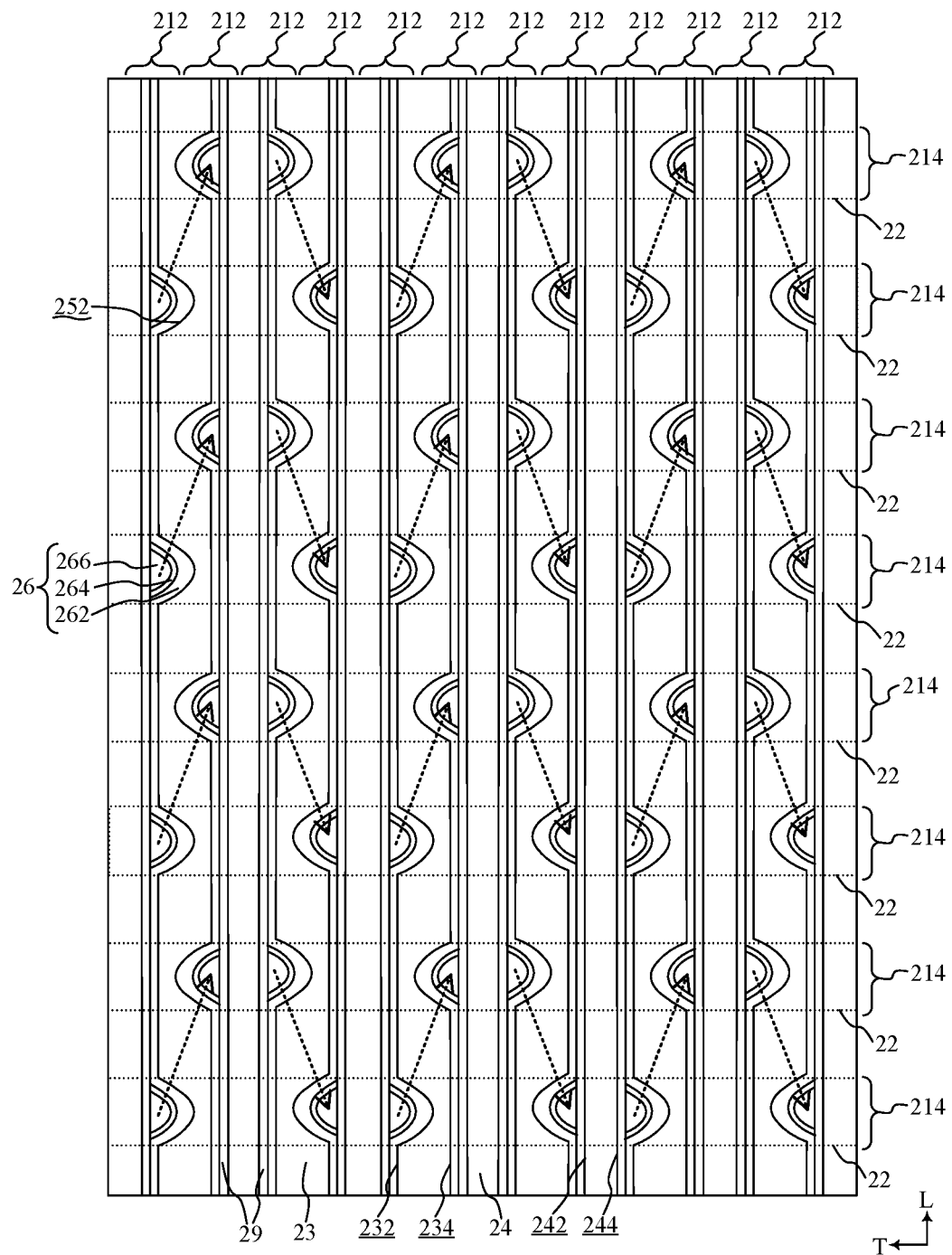
FIG. 25 is a top view of another modification of the NOR-type memory device according to the first preferred embodiment of the invention and removing top structures or elements.

Referring to FIG. 23, FIG. 24 and FIG. 25, and referring to FIG. 6 again, FIG. 23 is a top view of a modification of the NOR-type memory device 2 according to the first preferred embodiment of the invention and removing top structures or elements. FIG. 24 is a top view of another modification of the NOR-type memory device 2 according to the first preferred embodiment of the invention and removing top structures or elements. FIG. 25 is a top view of another modification of the NOR-type memory device 2 according to the first preferred embodiment of the invention and removing top structures or elements.

As shown in FIG. 6, FIG. 23, FIG. 24 and FIG. 25, the dashed arrows in those figures represent the directions of the memory cells 26 arranged on the first longitudinal edge 232 of each of the first isolation stripes 23 mapping the memory cells 26 on the second longitudinal edge 234 of said one first isolation stripe 23.

The directions of the dotted arrows indicated on the adjacent first isolation stripes 23 shown in FIG. 6, FIG. 23, FIG. 24 and FIG. 25 have different combinations. That is, for the NOR-type memory device 2 according to the first preferred embodiment of the invention, the symmetry of the memory cells 26 arranged on the first longitudinal edges 232 and the second longitudinal edges 234 of the adjacent first isolation stripes 23 has various combinations as shown in FIG. 6, FIG. 23, FIG. 24, and FIG. 25. The NOR-type memory devices 2 shown in FIG. 23, FIG. 24 and FIG. 25 also have all of the structural features of the NOR-type memory device 2 shown in FIG. 6. The components and structures in FIGS. 23 to 25 identical to those shown in FIG. 6 are given the same numerical notations, and will be not described in detail herein.

Figure 26:
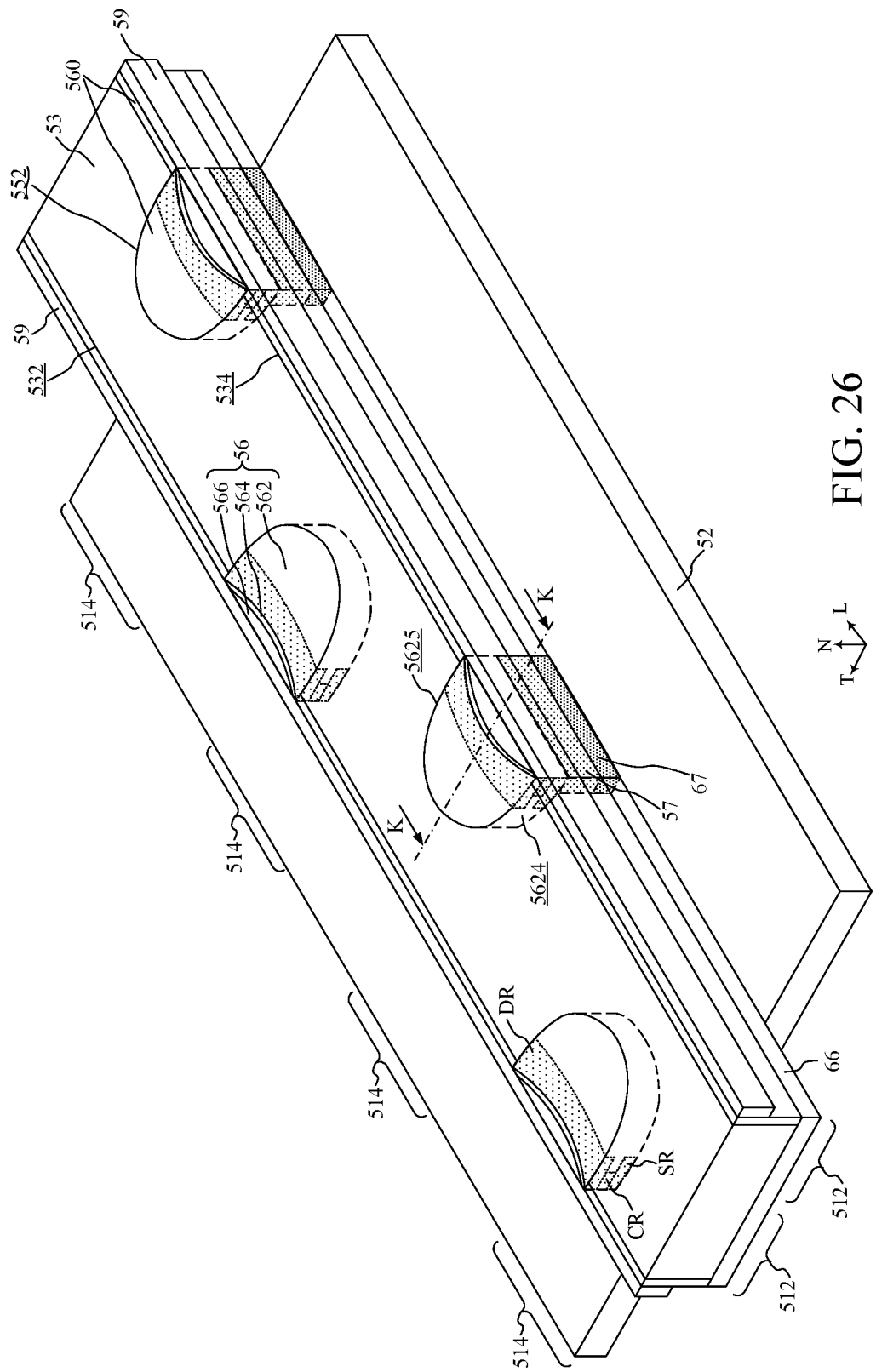
FIG. 26 is a perspective view of partial structure inside the NOR-type memory device according to the third preferred embodiment of the invention.
Figure 27:
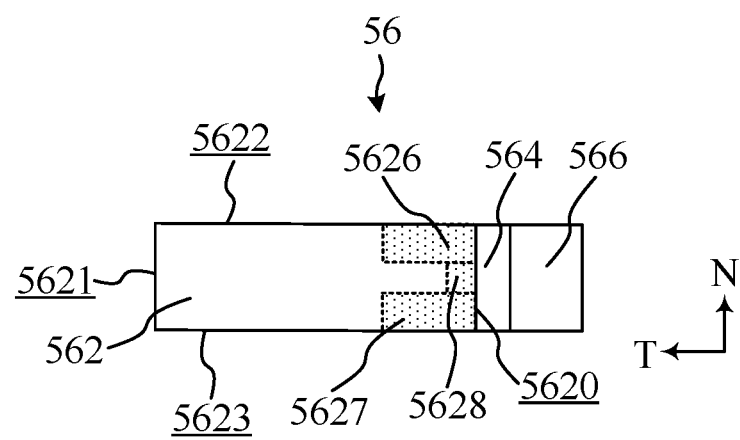
FIG. 27 is a cross-sectional view of a transistor of the NOR-type memory device according to the third preferred embodiment of the invention taken along the K-K line of FIG. 26.
Figure 28:
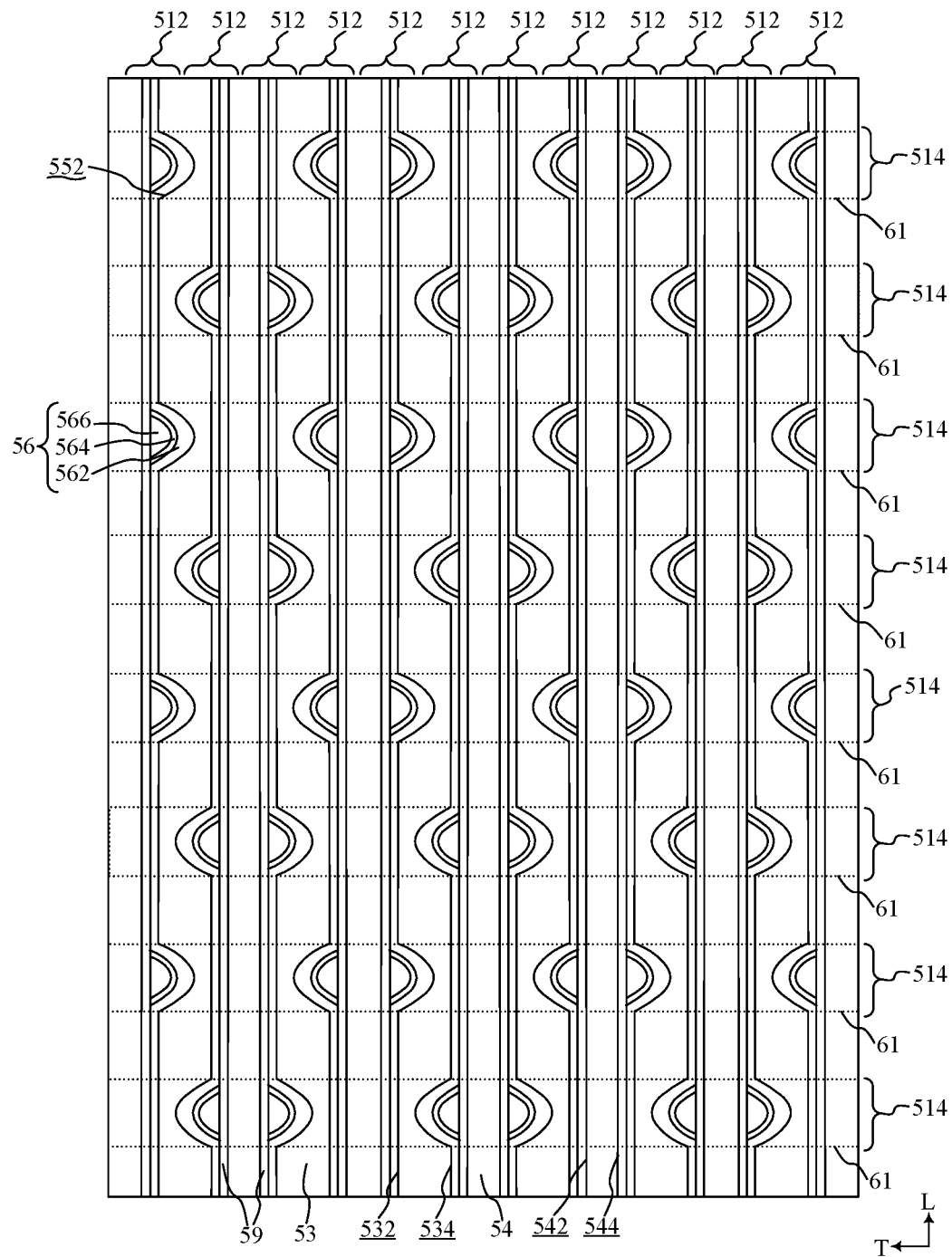
FIG. 28 is a top view of the NOR-type memory device according to the third preferred embodiment of the invention and removing top structures or elements.
Figure 29:
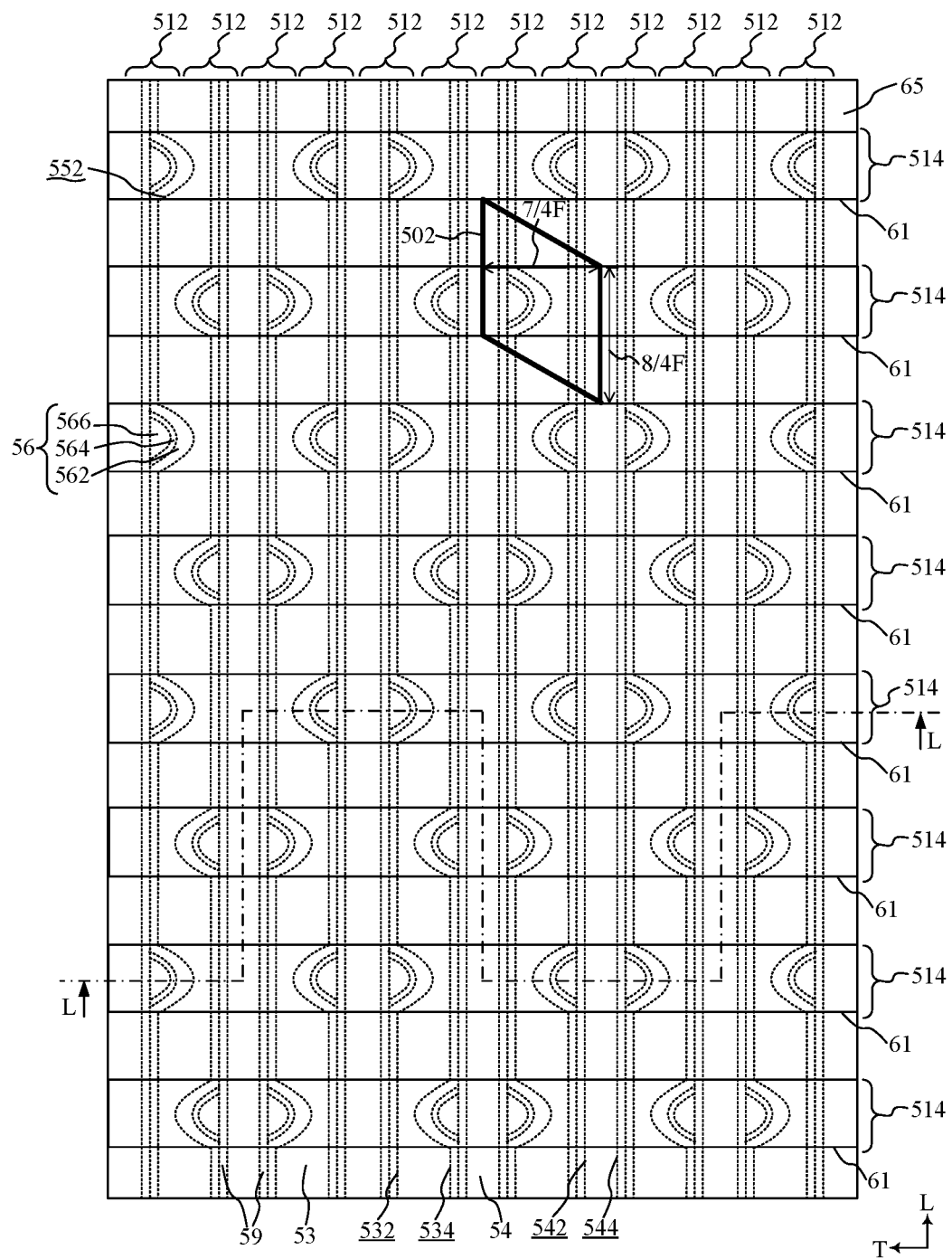
FIG. 29 is a top view of the NOR-type memory device according to the third preferred embodiment of the invention.
Figure 30:
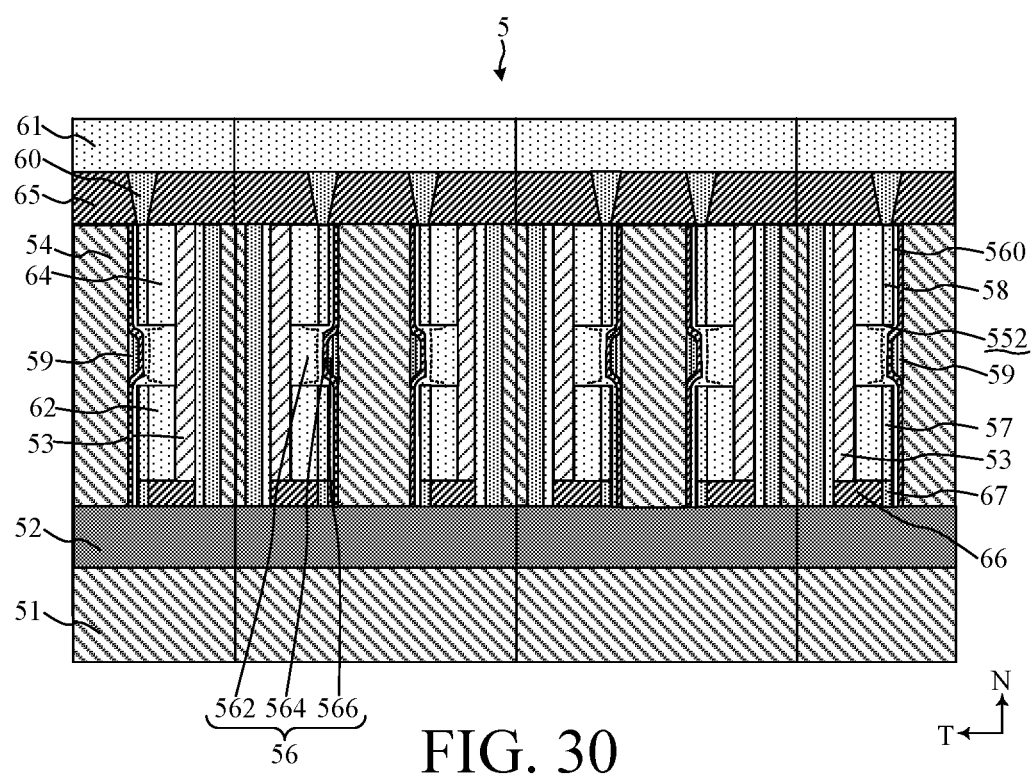
FIG. 30 is a cross-sectional schematic drawing of the NOR-type memory device according to the third preferred embodiment of the invention taken along the L-L line of FIG. 29.

Referring to FIG. 26, FIG. 27, FIG. 28, FIG. 29 and FIG. 30, those drawings schematically illustrate the NOR-type memory device 5 according to the third preferred embodiment of the invention. FIG. 26 is a perspective view schematically illustrating partial structure inside the NOR-type memory device 5 according to the third preferred embodiment of the invention. FIG. 27 is a cross-sectional view of a memory cell 26 of the NOR-type memory device 5 according to the third preferred embodiment of the invention taken along the K-K line of FIG. 26. FIG. 28 is a top view of the NOR-type memory device 5 according to the third preferred embodiment of the invention and removing top structures or elements. FIG. 29 is a top view of the NOR-type memory device 5 according to the third preferred embodiment of the invention. FIG. 30 is a cross-sectional schematic drawing of the NOR-type memory device 5 according to the third preferred embodiment of the invention taken along the L-L line of FIG. 29. The NOR-type memory device 5 according to the third preferred embodiment of the invention is mainly constituted by a plurality of transistors, i.e., memory cells, like that as shown in FIG. 1 and FIG. 2. Moreover, referring to FIG. 36, FIG. 36 is a cross-sectional schematic drawing of the semi-product of the NOR-type memory device 5 according to the invention during fabrication.

Figure 36:
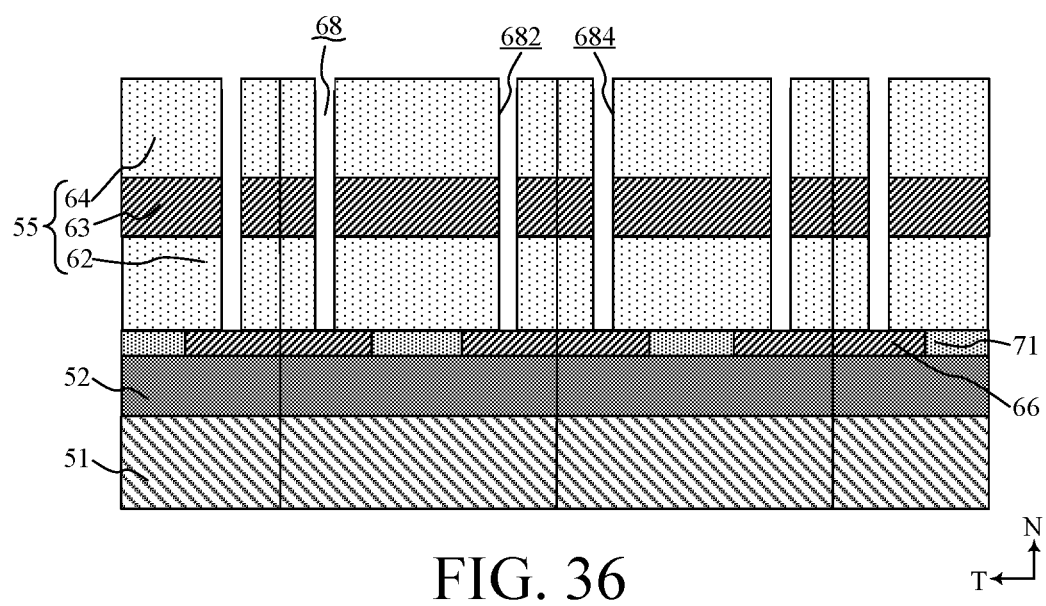
FIG. 36 is a cross-sectional schematic drawing of the semi-product of the NOR-type memory device taken along the O-O line of FIG. 35.

As shown in FIG. 26 to FIG. 30 and FIG. 36, the NOR-type memory device 5 according to the third preferred embodiment of the invention includes a semiconductor substrate 51, a grounding layer 52, a plurality of first isolation stripes 53, a plurality of second isolation stripes 54, a plurality of multi-layer stripes 55 (as shown in FIG. 36), a plurality of memory cells 56, a plurality of first sub-bit lines 57, a plurality of second sub-bit lines 58, a plurality of word lines 59, a plurality of bit line via contacts 60, and a plurality of bit lines 61. In FIG. 28, the dotted lines represent the plurality of bit lines 61 to be formed above the plurality of memory cells 56. In FIG. 29, the dashed lines represent the plurality of memory cells 56 formed below the second insulating layer 65 and the plurality of bit lines 61.

The semiconductor substrate 51 defines a longitudinal direction L, a transverse direction T, a normal direction N, a plurality of columns 512 in the longitudinal direction L, and a plurality of rows 514 in the transverse direction T.

In one embodiment, the semiconductor substrate 51 can be formed of sapphire, silicon, SiC, GaN, AlGaN, InGaN, ZnO, ScAlMgO$_4$, YSZ (yttria-stabilized zirconia), SrCu$_2$O$_2$, CuAlO$_2$, LaCuOS, NiO, LiGaO$_2$, LiAlO$_2$, GaAs, InP, or other semiconductor material.

The grounding layer 52 is formed on the semiconductor substrate 51.

The plurality of first isolation stripes 53 are formed on the grounding layer 52, and extend in the longitudinal direction L. Each first isolation stripe 53 has a respective first longitudinal edge 532 and a respective second longitudinal edge 534. The plurality of second isolation stripes 54 are formed on the grounding layer 52, and extends in the longitudinal direction L. Each second isolation stripe 54 has a respective third longitudinal edge 542 and a respective fourth longitudinal edge 544. The first isolation stripes 53 and the second isolation stripes 54 are alternatingly arranged.

Also as shown in FIG. 36, the plurality of multi-layer stripes 55 are constituted by a first semiconductor layer 62 formed on the grounding layer 52, a first insulating layer 63 formed on the first semiconductor layer 62 and a second semiconductor layer 64 formed on the first insulating layer 63. It is noted that the first insulating layer 63 exists during the manufacturing of the NOR-type memory device 5 according to the third preferred embodiment of the invention, and that the first insulating layer 63 is completely removed after the NOR-type memory device 5 according to the third preferred embodiment of the invention is finished.

Each multi-layer stripe 55 corresponds to one of the first isolation stripes 53 and to one of the second isolation stripes 54. Each multi-layer stripe 55 is located between the corresponding first isolation stripe 53 and the corresponding second isolation stripe 54. Each multi-layer stripe 55 has a plurality of recesses 552 being formed at the first insulating layer 63 and facing the third longitudinal edge 542 or the fourth longitudinal edge 544 of the corresponding second isolation stripe 54. The recesses 552 at one side of each first isolation stripe 53 and the recesses 552 at the other side of said one first isolation stripe 53 are staggeredly arranged. Each recess 552 corresponds to one of the columns 512 and one of the rows 514.

Each memory cell 56 corresponds to one of the recesses 552, and includes a respective pillar 562 of a semiconductor material 560. Each pillar 562 of the semiconductor material 560 is fitted in the corresponding recess 552, and extends in the transverse direction T. Each pillar 562 of the semiconductor material 560 has a respective base side face 5620 parallel to the normal direction N, a respective tapered side face 5621 opposite to the base side face 5620, a respective first top face 5622 perpendicular to the normal direction N, a respective bottom face 5623 opposite to the first top face 5622, a respective front side face 5624 adjacent to the base side face 5620 and the tapered side face 5621, and a respective rear side face 5625 opposite to the front side face 5624. Each pillar 562 of the semiconductor material 560 also has a respective first elongated portion 5626 sandwiched among the first top face 5622, the base side face 5620, the front side face 5624 and the rear side face 5625 forming a respective drain region DR. Each pillar 562 of the semiconductor material 560 also has a respective second elongated portion 5627 sandwiched among the bottom face 5623, the base side face 5620, the front side face 5624 and the rear side face 5625 forming a respective source region SR. Each pillar 562 of the semiconductor material 560 also has a respective plate portion 5628 on the base side face 5620 and between the first elongated portion 5626, the second elongated portion 5627 forming a respective channel region CR, and other portion of the pillar 562 forming a respective body region. In practical, the semiconductor material 560 may be also overlaid on the first longitudinal edges 532 and the second longitudinal edges 534 of the first isolation stripes 53.

In some embodiments, the semiconductor material 560 forming the pillar 562 can be, for example, polysilicon. The source region SR and the drain region DR can be doped with an n-type dopant (e.g., phosphorus or arsenic) or a p-type dopant (e.g., boron). The channel region CR can be doped with a dopant of a different conductivity from the source region SR and the drain region DR. A portion of the body region that is away from the channel region CR, the source region SR and the drain region DR can be optionally doped with the specific dopant.

Each memory cell 56 also includes a respective gate oxide (i.e., tunneling oxide)/gate dielectric multi-layer 564 overlaying the base side face 5620 of the corresponding pillar 562 of the semiconductor material 560 and a respective gate conductor 566 overlaying the gate oxide/gate dielectric multi-layer 564. Each first sub-bit line 57 is formed at the first semiconductor layer 62, and corresponds to one of the memory cells 56. Each first sub-bit line 57 connects between the source region SR of the corresponding memory cell 56 and the grounding layer 52. Each second sub-bit line 58 is formed at the second semiconductor layer 64, and corresponds to one of the memory cells 56. Each second sub-bit line 58 connects the drain region DR of the corresponding memory cell 56.

Each of the word lines 59 corresponds to one of the columns 512, and connects the gate conductors 566 along the corresponding column 512.

The NOR-type memory device 5 according to the third preferred embodiment of the invention also includes a second insulating layer 65. The second insulating layer 65 is formed on the second semiconductor layer 64, the first isolation stripes 53 and the second isolation stripes 54. Each of the bit line via contacts 60 corresponds to one of the second sub-bit lines 58, and is formed through the second insulating layer 65 to connect the corresponding second sub-bit line 58. The plurality of bit lines 61 are formed on the second insulating layer 65. Each bit line 61 corresponds to one of the rows 514, extends along the corresponding row 514, and connects the bit line via contacts 60 along the corresponding row 514.

In one embodiment, the base side face 5620 can be planar, convex or concave.

In one embodiment, in each memory cell 56, a combination of the first top face 5622 of the pillar 562 of the semiconductor material 560, a second top face of the gate oxide/gate dielectric multi-layer 564 and a third top face of the gate conductor 566 can exhibit a semi-ellipse, a semi-circle, a triangle, a finger-like shape or a trapezoid.

Further, the NOR-type memory device 5 according to the third preferred embodiment of the invention also includes a third insulating layer 66 and a plurality of connection lines 67. The third insulating layer 66 is formed to overlay the grounding layer 52, and is formed between the first isolation stripes 53, the second isolation stripes 54 and the grounding layer 52. Each of the connection lines 67 corresponds to one of the first sub-bit lines 57, and is formed through the third insulating layer 66 to connect between the corresponding first sub-bit lines 57 and the grounding layer 52. The connection lines 67 specify stable current density and direction.

Also as shown in FIG. 29, each memory cell block 502 is encircled in a bold line parallelogram with a side length of 2F where F represents the process feature size (i.e., the minimum lithographic feature size). By the bold line parallelogram, the cell size of the NOR-type memory device 5 according to the third preferred embodiment of the invention is calculated by the following formula:

cell size=$8/4F \times 7/4F=3.5F^2$

Therefore, on theory, a cell size of the NOR-type memory device according to the third preferred embodiment of the invention is equal to 3.5 times a square of a process feature size.

Referring to FIGS. 31 through 42, those drawings schematically illustrate a method, according to the fourth preferred embodiment of the invention, of fabrication a NOR-type memory device 5 as shown in FIG. 26 to FIG. 30.

Figure 31:
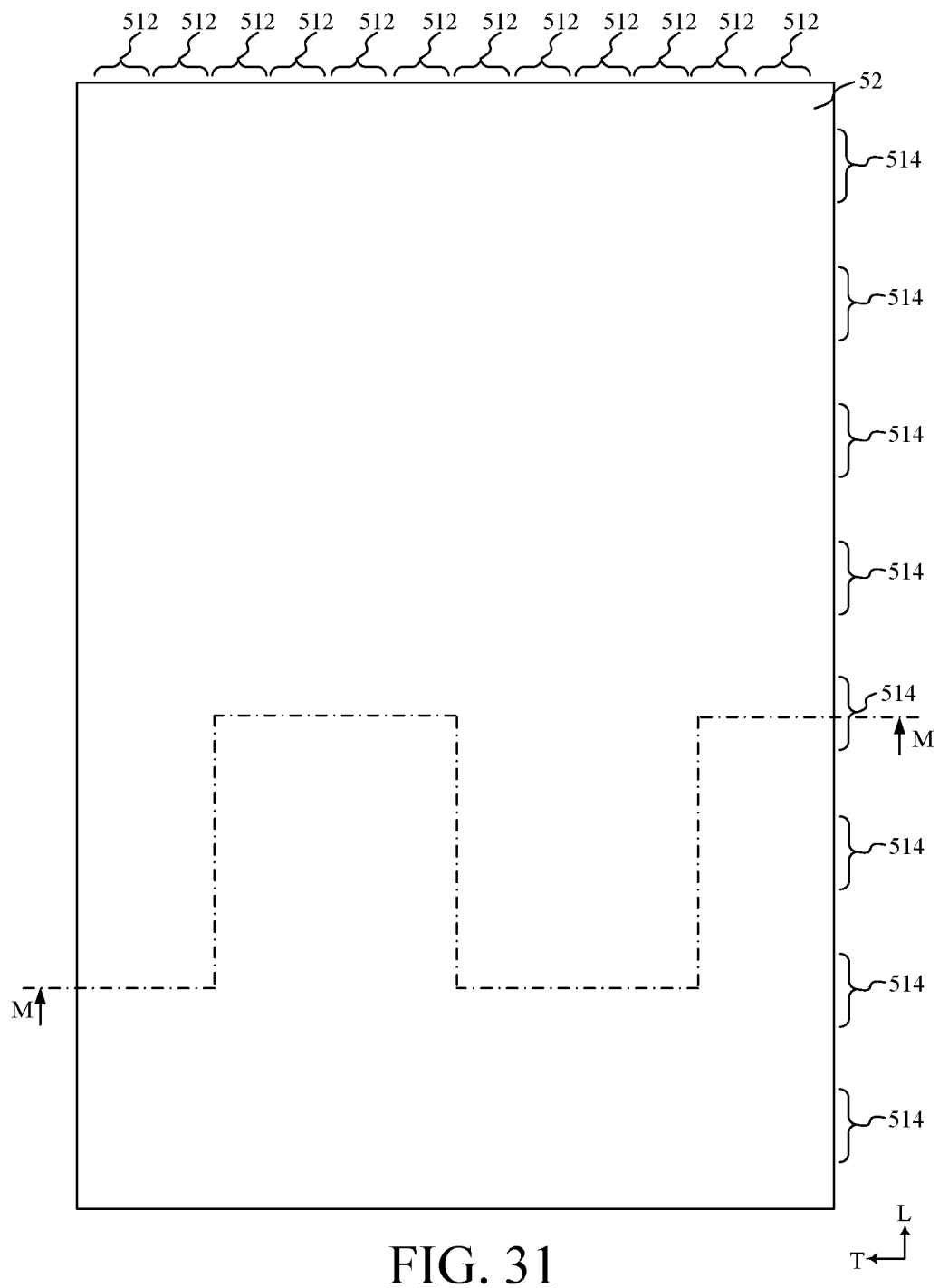
FIG. 31 is a top view of a semi-product of the NOR-type memory device fabricated by the method according to the fourth preferred embodiment of the invention.
Figure 32:
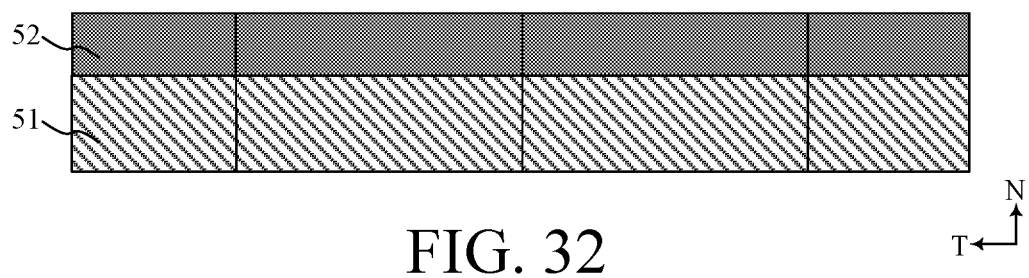
FIG. 32 is a cross-sectional schematic drawing of the semi-product of the NOR-type memory device taken along the M-M line of FIG. 31.

Referring to FIG. 31 and FIG. 32, FIG. 31 is a top view of a semi-product of the NOR-type memory device 5 fabricated by the method according to the fourth preferred embodiment of the invention. FIG. 32 is a cross-sectional schematic drawing of the semi-product of the NOR-type memory device 5 taken along the M-M line of FIG. 31. As shown in FIG. 31 and FIG. 32, the method according to the fourth preferred embodiment of the invention, firstly, is to form a grounding layer 52 on a semiconductor substrate 51, where the semiconductor substrate 51 defines a longitudinal direction L, a transverse direction T, a normal direction N, a plurality of columns 512 in the longitudinal direction L, and a plurality of rows 514 in the transverse direction T.

Figure 33:
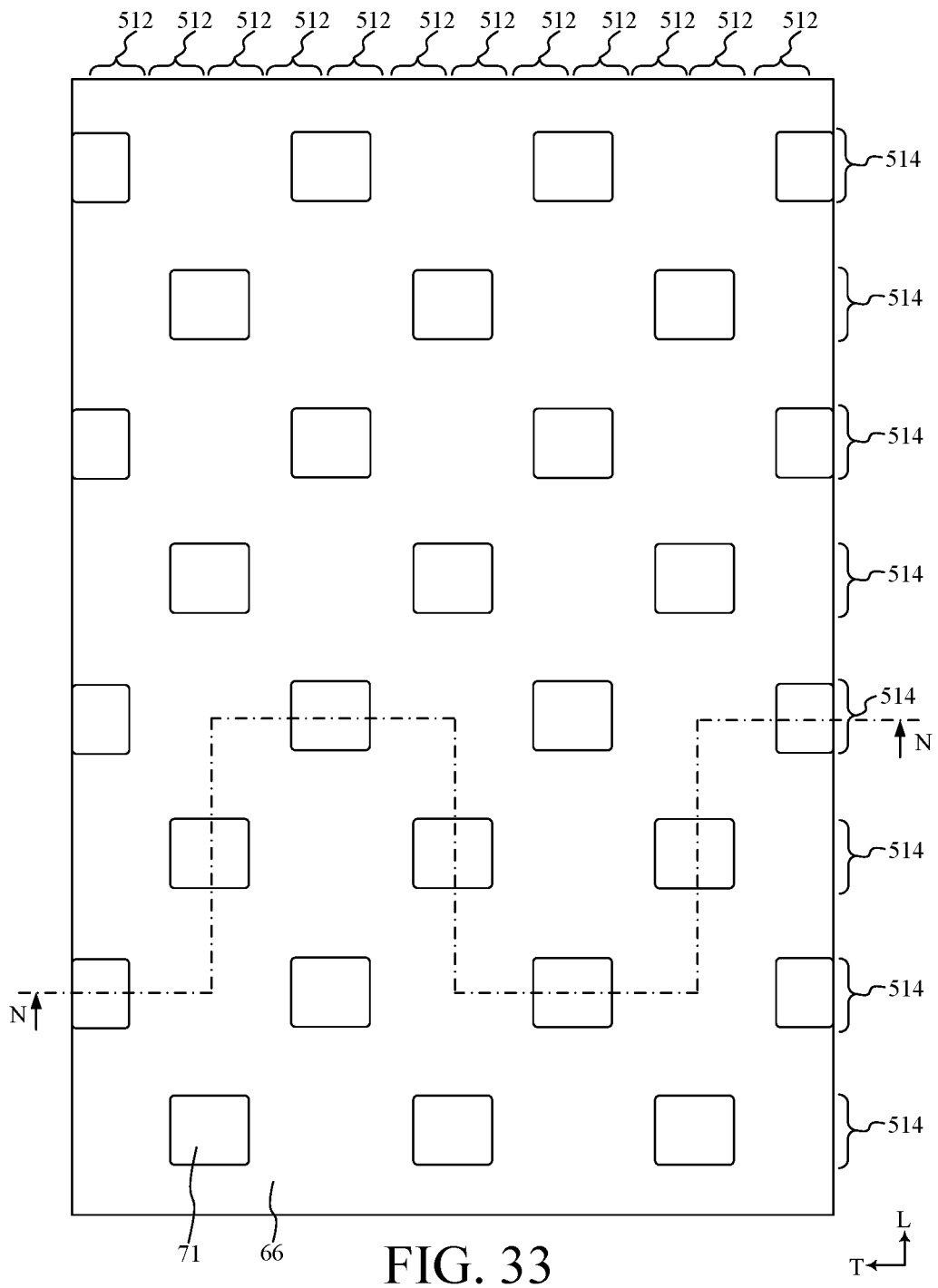
FIG. 33 is another top view of the semi-product of the NOR-type memory device fabricated by the method according to the fourth preferred embodiment of the invention.
Figure 34:
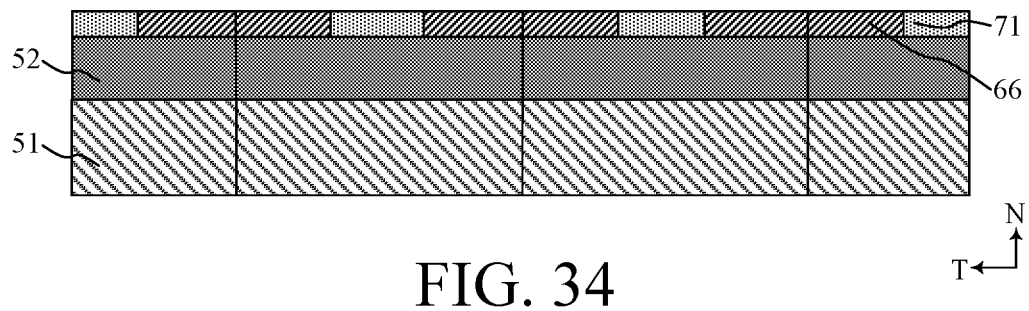
FIG. 34 is a cross-sectional schematic drawing of the semi-product of the NOR-type memory device taken along the N-N line of FIG. 33.

Referring to FIG. 33 and FIG. 34, FIG. 33 is another top view of the semi-product of the NOR-type memory device 5 fabricated by the method according to the fourth preferred embodiment of the invention. FIG. 34 is a cross-sectional schematic drawing of the semi-product of the NOR-type memory device 5 taken along the N-N line of FIG. 33. As shown in FIG. 33 and FIG. 34, subsequently, the method according to the fourth preferred embodiment of the invention is to form a third insulating layer 66 to overlay the grounding layer 52. Also as shown in FIG. 33 and FIG. 34, next, the method according to the fourth preferred embodiment of the invention is to form a plurality of conductive pads 71 which each corresponds to one of the rows 514 and two of the columns 512 and is formed at the corresponding row 514 and the correspond two columns 512 and through the third insulating layer 66 to contact the grounding layer 52.

Figure 35:
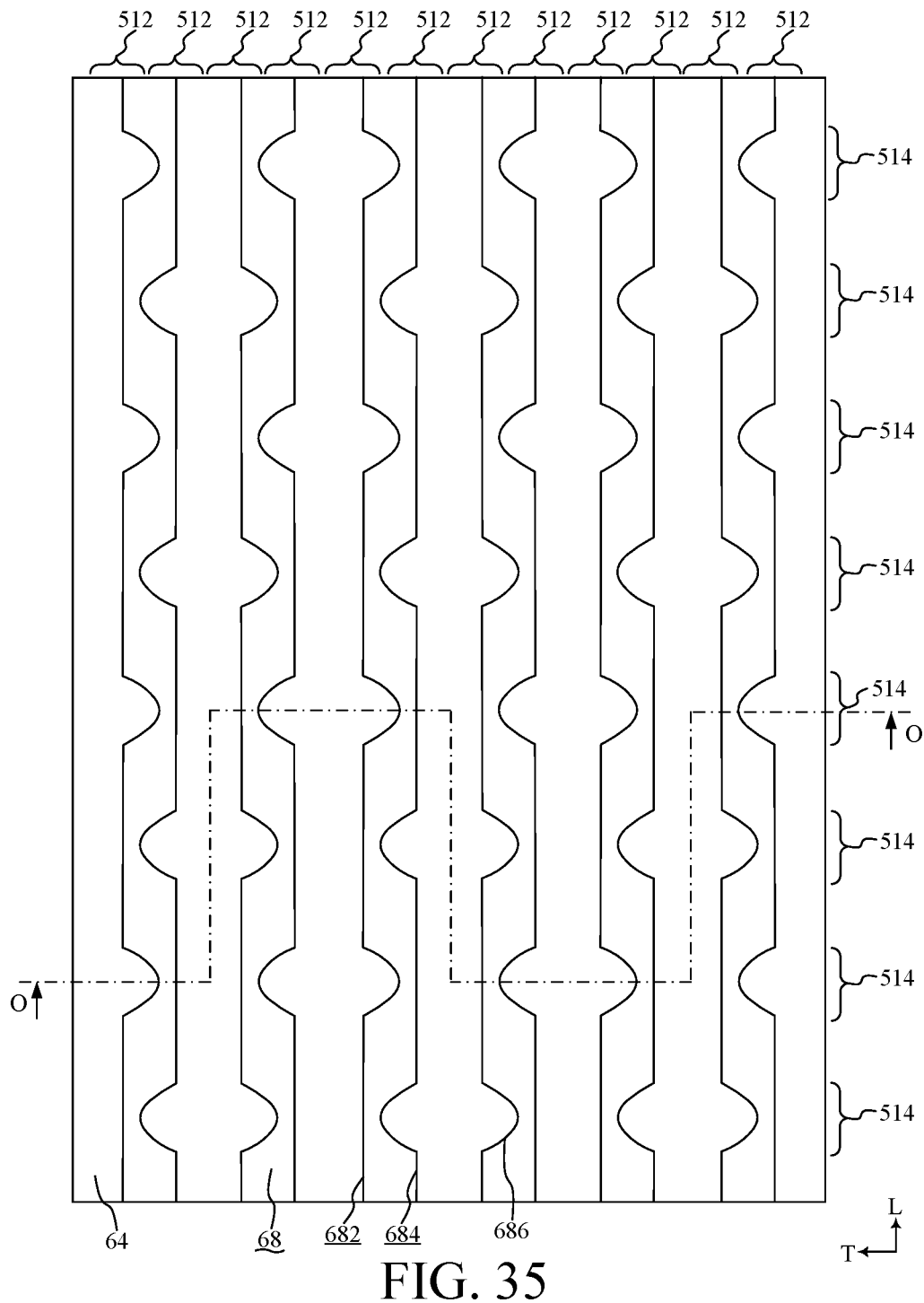
FIG. 35 is another top view of the semi-product of the NOR-type memory device fabricated by the method according to the fourth preferred embodiment of the invention.

Referring to FIG. 35 and referring to FIG. 36 again, FIG. 35 is another top view of the semi-product of the NOR-type memory device 5 fabricated by the method according to the fourth preferred embodiment of the invention. FIG. 36 is a cross-sectional schematic drawing of the semi-product of the NOR-type memory device 5 taken along the O-O line of FIG. 35. As shown in FIG. 35 and FIG. 36, next, the method according to the fourth preferred embodiment of the invention is to form a first semiconductor layer 62 on the third insulating layer 66 and the conductive pads 71. Also as shown in FIG. 35 and FIG. 36, then, the method according to the fourth preferred embodiment of the invention is to form a first insulating layer 63 on the first semiconductor layer 62. Also as shown in FIG. 35 and FIG. 36, subsequently, the method according to the fourth preferred embodiment of the invention is to form a second semiconductor layer 64 on the first insulating layer 63. Also as shown in FIG. 35 and FIG. 36, afterward, the method according to the fourth preferred embodiment of the invention is to form a plurality of first trenches 68 parallel to the longitudinal direction L and through the first semiconductor layer 62, the first insulating layer 63 and the second semiconductor layer 64, where each first trench 68 has a respective first longitudinal side wall 682, a respective second longitudinal side wall 684 and a plurality of protrusions 686 protruding inwardly. The protrusions 686 on the first longitudinal side wall 682 and the protrusions 686 on the second longitudinal side wall 684 are staggeredly arranged.

Figure 37:
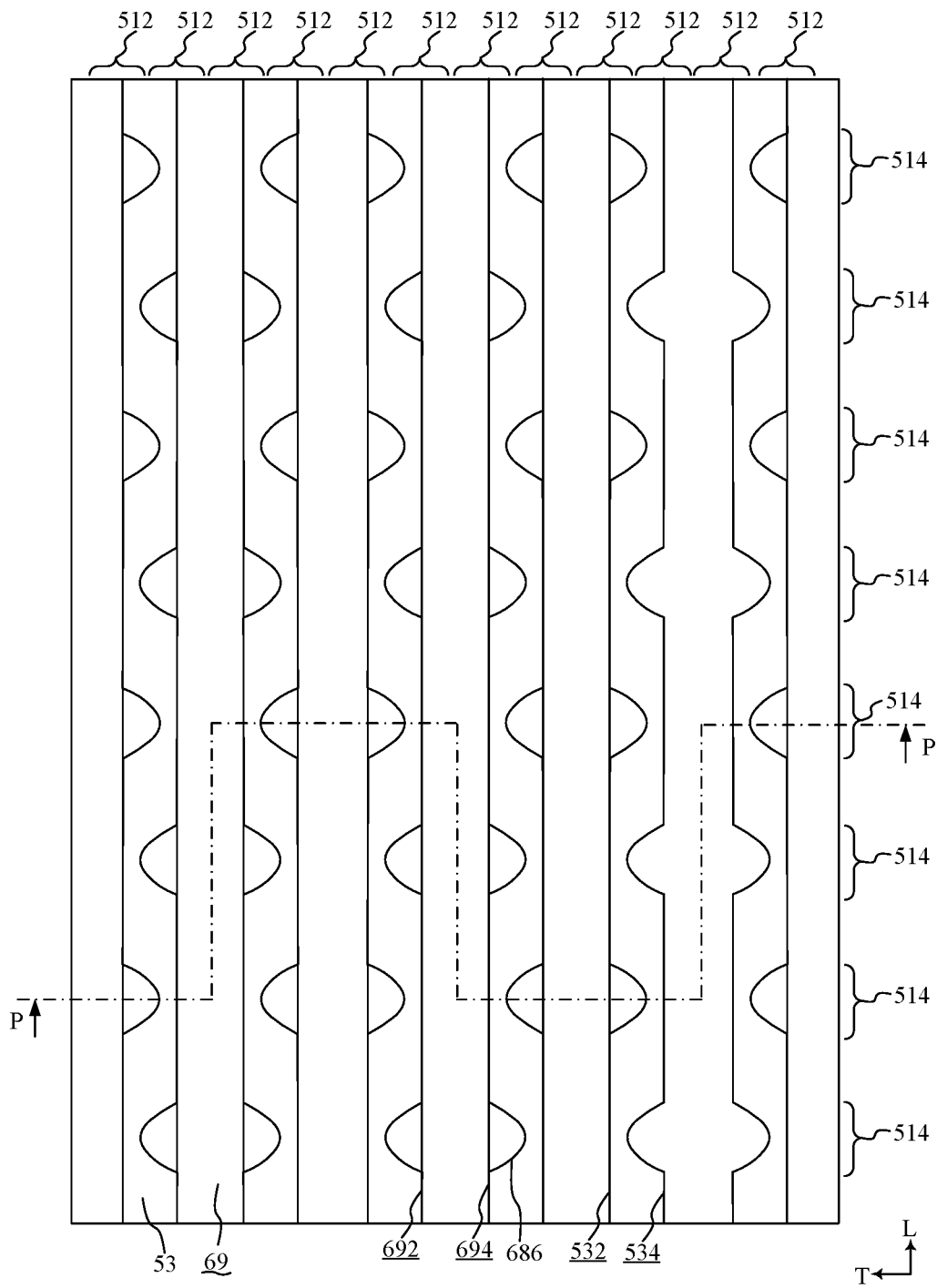
FIG. 37 is another top view of the semi-product of the NOR-type memory device fabricated by the method according to the fourth preferred embodiment of the invention.
Figure 38:
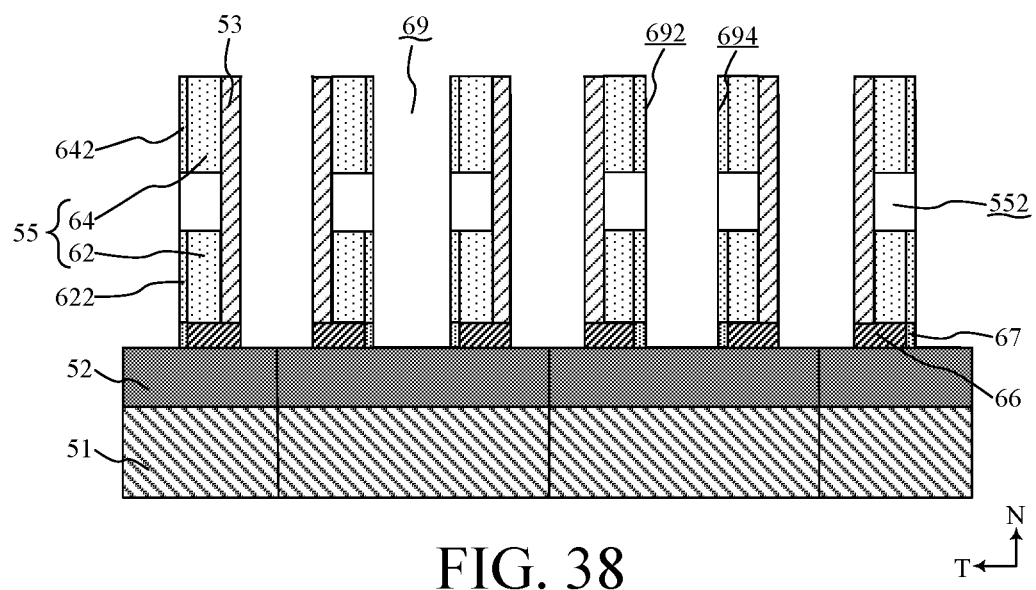
FIG. 38 is a cross-sectional schematic drawing of the semi-product of the NOR-type memory device taken along the P-P line of FIG. 37.

Referring to FIG. 37 and FIG. 38, FIG. 37 is another top view of the semi-product of the NOR-type memory device 5 fabricated by the method according to the fourth preferred embodiment of the invention. FIG. 38 is a cross-sectional schematic drawing of the semi-product of the NOR-type memory device 5 taken along the P-P line of FIG. 37. As shown in FIG. 37 and FIG. 38, next, the method according to the fourth preferred embodiment of the invention is to form a plurality of first isolation stripes 53 which each is filled in one of the first trenches 68 such that a plurality of multi-layer stripes 55 of the first semiconductor layer 62, the first insulating layer 63 and the second semiconductor layer 64 and the first isolation stripes 53 are alternately arranged. Each first isolation stripe 53 has a respective first longitudinal edge 532 and a respective second longitudinal edge 534.

Also as shown in FIG. 37 and FIG. 38, then, the method according to the fourth preferred embodiment of the invention is to form a plurality of second trenches 69 parallel to the longitudinal direction L, where each second trench 69 is formed on a portion of one of the multi-layer stripes 55 and through the first semiconductor layer 62, the first insulating layer 63 and the second semiconductor layer 64, and has a respective third longitudinal side wall 692 and a respective fourth longitudinal side wall 694.

Also as shown in FIG. 37 and FIG. 38, subsequently, the method according to the fourth preferred embodiment of the invention is to partially dope the first semiconductor layer 62 and the second semiconductor layer 64 on the third longitudinal side wall 692 and the fourth longitudinal side wall 694 of each second trench 69 to form a plurality of first conductive portions 622 on the first semiconductor layer 62 and a plurality of second conductive portions 642 on the second semiconductor layer 64, where each first conductive portion 622 and each second conductive portion 642 correspond to one of the protrusions 686.

Also as shown in FIG. 37 and FIG. 38, afterward, the method according to the fourth preferred embodiment of the invention is to remove a plurality of retained portions of the first insulating layer 63 which each corresponds to one of the protrusions 686 such that a plurality of recesses 552 are formed on the third longitudinal side walls 692 and the fourth longitudinal side walls 694 of the second trenches 69, where the recesses 552 at one side of each first isolation stripe 53 and the recesses 552 at the other side of said one first isolation stripe 53 are staggeredly arranged. Each recess 552 corresponds to one of the columns 512 and one of the rows 514.

Figure 39:
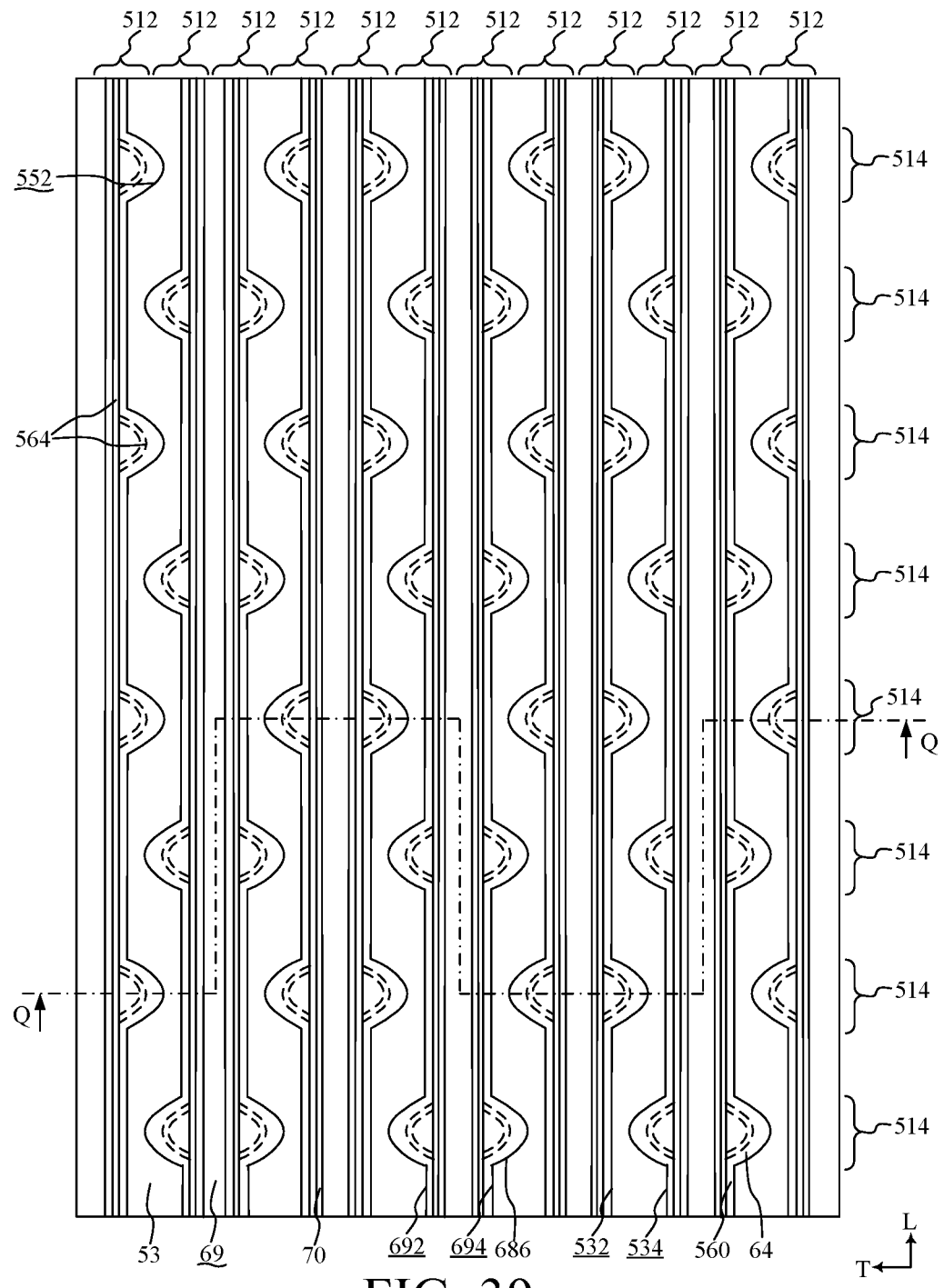
FIG. 39 is another top view of the semi-product of the NOR-type memory device fabricated by the method according to the fourth preferred embodiment of the invention.
Figure 40:
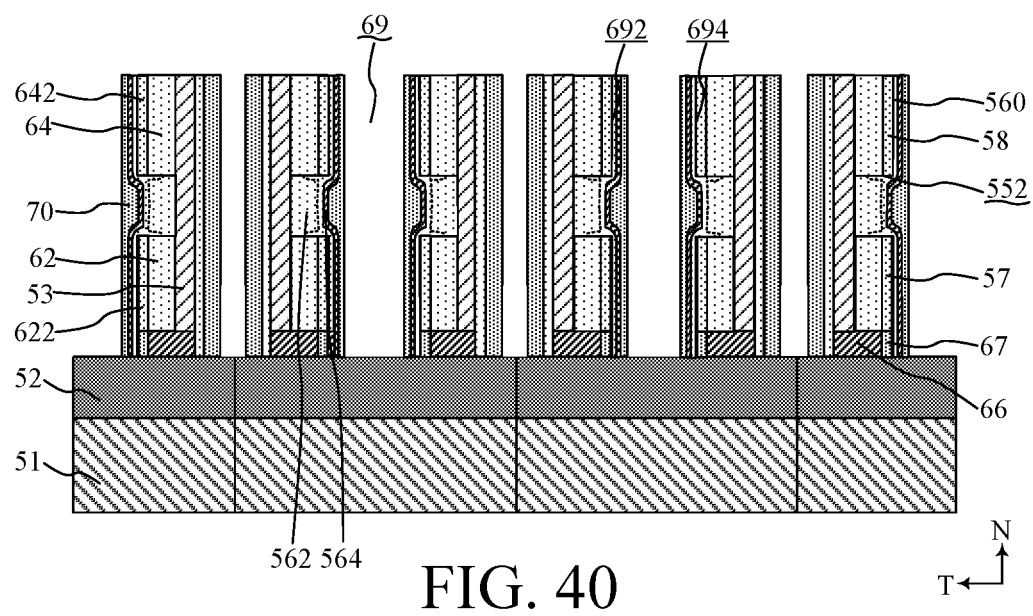
FIG. 40 is a cross-sectional schematic drawing of the semi-product of the NOR-type memory device taken along the Q-Q line of FIG. 39.

Referring to FIG. 39 and FIG. 40, FIG. 39 is another top view of the semi-product of the NOR-type memory device 5 fabricated by the method according to the fourth preferred embodiment of the invention. FIG. 40 is a cross-sectional schematic drawing of the semi-product of the NOR-type memory device 5 taken along the Q-Q line of FIG. 39. As shown in FIG. 39 and FIG. 40, next, the method according to the fourth preferred embodiment of the invention is to form a plurality of pillars 562 of a semiconductor material 560, where the pillars 562 of the semiconductor material 560 are arranged in the columns 512 and the rows 514. In order to easily manufacture, the semiconductor material 560 forming the pillars 562 can also overlay the first conductive portions 622 and the second conductive portions 642.

Referring to FIG. 26 and FIG. 27 again, each pillar 562 of the semiconductor material 560 is fitted in one of the recesses 552, and extends in the transverse direction T. Each pillar 562 of the semiconductor material 560 has a respective base side face 5620 parallel to the normal direction N, a respective tapered side face 5621 opposite to the base side face 5620, a respective first top face 5622 perpendicular to the normal direction N, a respective bottom face 5623 opposite to the first top face 5622, a respective front side face 5624 adjacent to the base side face 5620 and the tapered side face 5621, and a respective rear side face 5625 opposite to the front side face 5624. Each pillar 562 of the semiconductor material 560 also has a respective first elongated portion 5626 sandwiched among the first top face 5622, the base side face 5620, the front side face 5624 and the rear side face 5625 to form a respective drain region DR, a respective second elongated portion 5627 sandwiched among the bottom face 5623, the base side face 5620, the front side face 5624 and the rear side face 5625 to form a respective source region SR, a respective plate portion 5628 on the base side face 5620 and between the first elongated portion 5626 and the second elongated portion 5627 to form a respective channel region CR, and other portion of the pillar 562 of the semiconductor material 560 to form a respective body region. In practical, the semiconductor material 560 may be also overlaid on the third longitudinal side walls 692 and the fourth longitudinal side walls 694 of the second trenches 69.

Each of the first conductive portions 622 serves as one of a plurality of first sub-bit lines 57 which each correspond to one of the pillars 562 and connects between the source region SR of the corresponding pillar 562 and the grounding layer 52. Each of the second conductive portions 642 serves as one of a plurality of second sub-bit lines 58 which each corresponds to one of the pillars 562 and connects the drain region DR of the corresponding pillar 562.

Also as shown FIG. 39 and FIG. 40, then, the method according to the fourth preferred embodiment of the invention is to form a plurality of gate oxide (i.e., tunneling oxide)/gate dielectric multi-layers 564 which each overlays the base side face 5620 of one of the pillars 562 of the semiconductor material 560. In order to easily manufacture, the gate oxide/gate dielectric multi-layers 564 can also overlay the semiconductor material 560 overlaying the first conductive portions 622 and the second conductive portions 642.

Also as shown FIG. 39 and FIG. 40, subsequently, the method according to the fourth preferred embodiment of the invention is to form a plurality of conductor layers 70 which each overlays one of the third longitudinal side wall 692 and the fourth longitudinal side wall 694 of one of the second trenches 69. In practical, each of the conductor layers 70 may be also overlaid on one of the gate oxide/gate dielectric multi-layers 564 and the semiconductor material 560.

Figure 41:
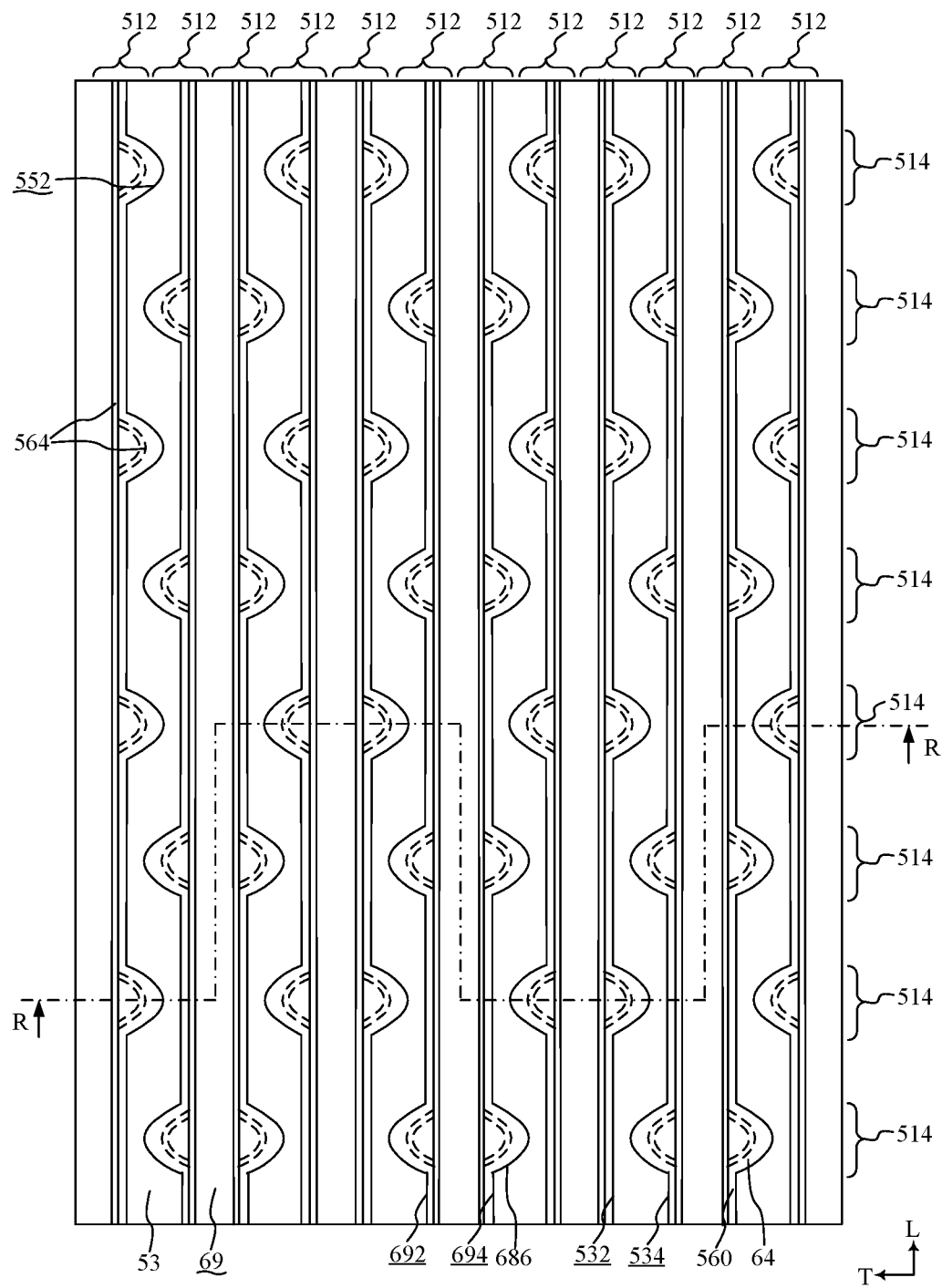
FIG. 41 is another top view of the semi-product of the NOR-type memory device fabricated by the method according to the fourth preferred embodiment of the invention.
Figure 42:
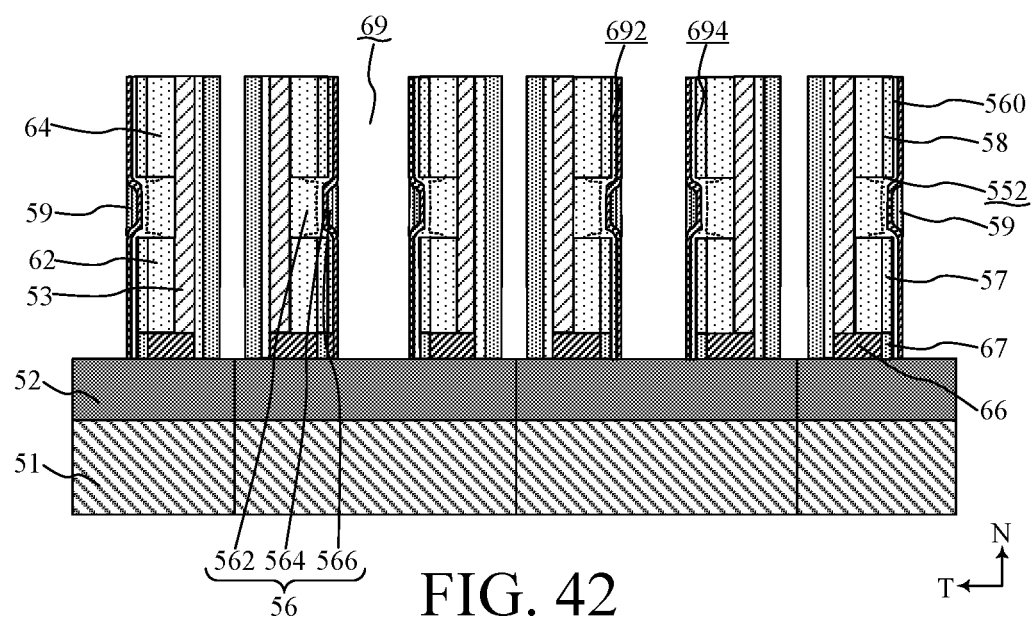
FIG. 42 is a cross-sectional schematic drawing of the semi-product of the NOR-type memory device taken along the R-R line of FIG. 41.

Referring to FIG. 41 and FIG. 42, FIG. 41 is another top view of the semi-product of the NOR-type memory device 5 fabricated by the method according to the fourth preferred embodiment of the invention. FIG. 42 is a cross-sectional schematic drawing of the semi-product of the NOR-type memory device 5 taken along the R-R line of FIG. 41. As shown in FIG. 41 and FIG. 42, afterward, the method according to the fourth preferred embodiment of the invention is to partially etch the conductor layers 70 to form a plurality of gate conductors 566 and a plurality of word lines 59, where each gate conductor 566 overlays one of the gate oxide/gate dielectric multi-layers 564, each word line 59 corresponds to one of the columns 512 and connects the gate conductors 566 along the corresponding column 512. In order to increase the volume of the gate conductors 566 and the word lines 59, another semiconductor material (not shown in FIG. 40 and FIG. 42) can overlay the gate oxide/gate dielectric multi-layers 564 overlaying the semiconductor material 560 overlaying the first conductive portions 622 and the second conductive portions 642 before the formation of the conductor layers 70.

It is noted that the portions of the conductive pads 71 within the second trenches 69 are removed to change the conductive pads 71 into a plurality of connection lines 67 which each corresponds to one of the first sub-bit lines 57 and connects between the corresponding first sub-bit lines 57 and the grounding layer 52.

Figure 43:
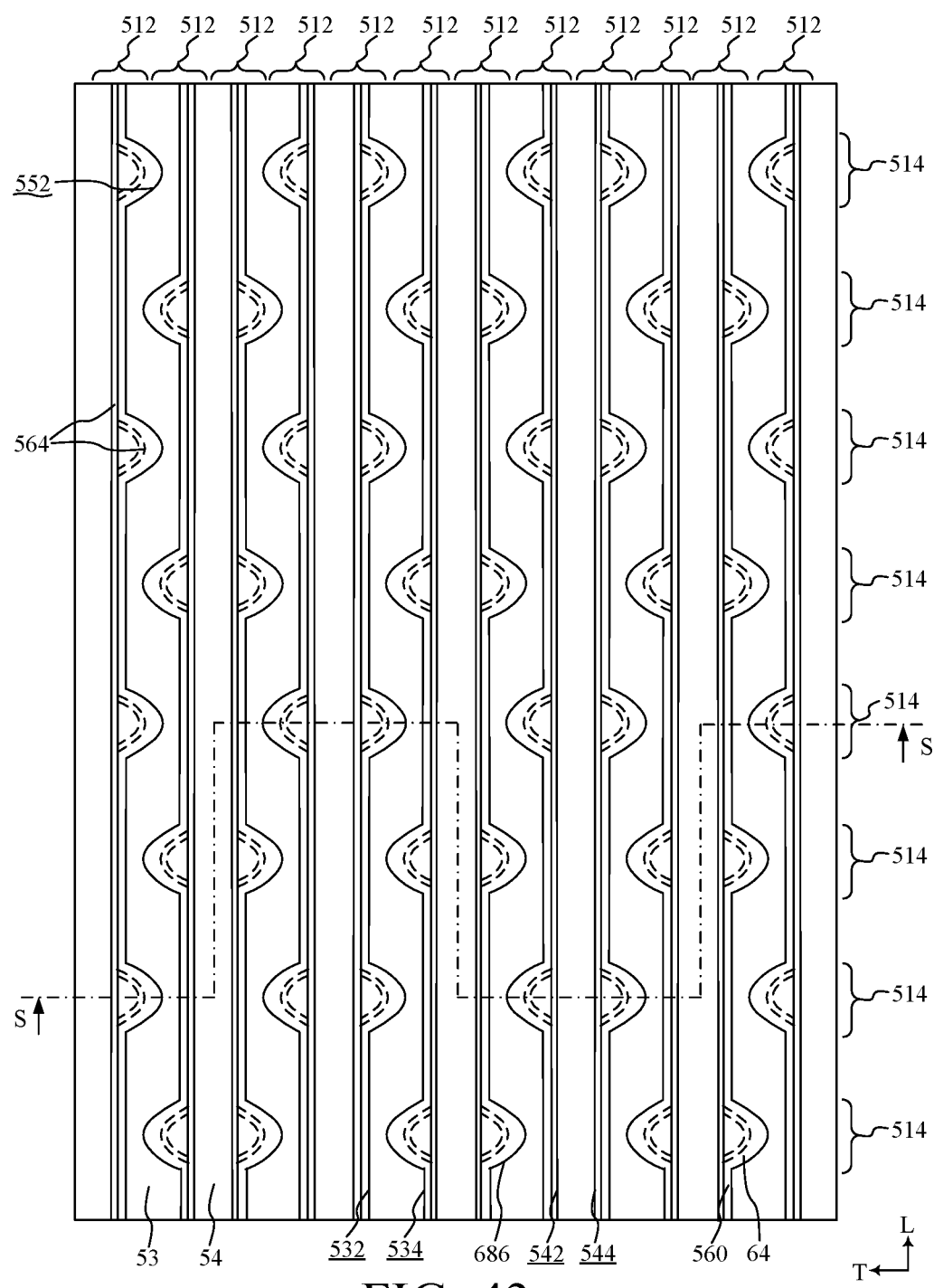
FIG. 43 is another top view of the semi-product of the NOR-type memory device fabricated by the method according to the fourth preferred embodiment of the invention.
Figure 44:
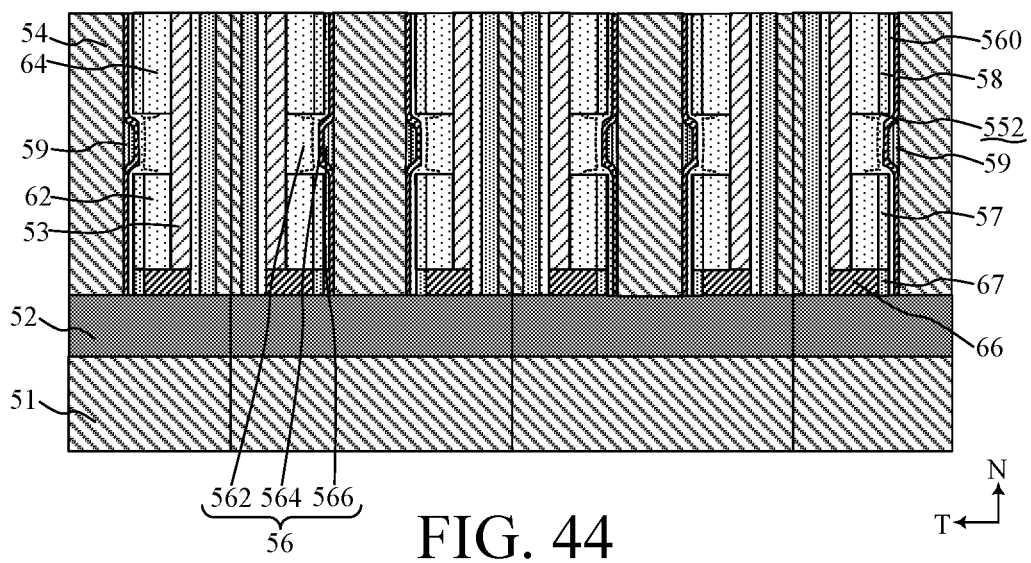
FIG. 44 is a cross-sectional schematic drawing of the semi-product of the NOR-type memory device taken along the S-S line of FIG. 43.

Referring to FIG. 43 and FIG. 44, FIG. 43 is another top view of the semi-product of the NOR-type memory device 5 fabricated by the method according to the fourth preferred embodiment of the invention. FIG. 44 is a cross-sectional schematic drawing of the semi-product of the NOR-type memory device 5 taken along the S-S line of FIG. 43. As shown in FIG. 43 and FIG. 44, next, the method according to the fourth preferred embodiment of the invention is to form a plurality of second isolation stripes 54 which each is filled in one of the second trenches 69.

Referring to FIG. 29 and FIG. 30 again, then, the method according to the fourth preferred embodiment of the invention is to form a second insulating layer 65 on the second semiconductor layer 64, the first isolation stripes 53 and the second isolation stripes 54. Also as shown in FIG. 29 and FIG. 30, subsequently, the method according to the fourth preferred embodiment of the invention is to form a plurality of bit line via contacts 60 which each corresponds to one of the second sub-bit lines 58 and is formed through the second insulating layer 65 to connect the corresponding second sub-bit line 58. Also as shown in FIG. 29 and FIG. 30, finally, the method according to the fourth preferred embodiment of the invention is to form a plurality of bit lines 61 on the second insulating layer 65. Each bit line 61 corresponds to one of the rows 514, extends along the corresponding row 514, and connects the bit line via contacts 60 along the corresponding row.

Similarly, for the NOR-type memory device 5 according to the third preferred embodiment of the invention, the symmetry of the memory cells 56 arranged on the first longitudinal edges 532 and the second longitudinal edges 534 of the adjacent first isolation stripes 53 has various combinations like those as shown in FIG. 6 FIG. 23, FIG. 24, and FIG. 25.

With detailed description of the invention above, it is clear that the NOR-type memory device according to the invention is constituted by a plurality of vertical current type FanFETs, and may have a cell size of less than $4F^2$.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A NOR-type memory device, comprising:
   a semiconductor substrate, defining a longitudinal direction, a transverse direction, a normal direction, a plurality of columns in the longitudinal direction, and a plurality of rows in the transverse direction;
   a plurality of bit lines, formed on the semiconductor substrate, each bit line corresponding to one of the rows and extending in the corresponding row;
   a plurality of first isolation stripes, being formed on the bit lines and extending in the longitudinal direction, each first isolation stripe having a respective first longitudinal edge and a respective second longitudinal edge;
   a plurality of second isolation stripes, being formed on the bit lines and extending in the longitudinal direction, each second isolation stripe having a respective third longitudinal edge and a respective fourth longitudinal edge, the first isolation stripes and the second isolation stripes being alternatingly arranged;
   a plurality of multi-layer stripes, constituted by a first semiconductor layer formed on the bit lines, a first insulating layer formed on the first semiconductor layer and a second semiconductor layer formed on the first insulating layer, each multi-layer stripe corresponding to one of the first isolation stripes and to one of the second isolation stripes and being located between the corresponding first isolation stripe and the corresponding second isolation stripe, wherein each multi-layer stripe has a plurality of recesses being formed at the first insulating layer and facing the third longitudinal edge or the fourth longitudinal edge of the corresponding second isolation stripe, the recesses at one side of each first isolation stripe and the recesses at the other side of said one first isolation stripe are staggeredly arranged, each recess corresponds to one of the columns and to one of the rows;
   a plurality of memory cells, each of the memory cells corresponding to one of the recesses and comprising a respective pillar of a semiconductor material, each pillar of the semiconductor material being fitted in the corresponding recess and extending in the transverse direction and having a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the first top face, the base side face, the front side face and the rear side face to form a respective source region, a respective second elongated portion sandwiched among the bottom face, the base side face, the front side face and the rear side face to form a respective drain region, a respective plate portion on the base side face and between the first elongated portion and the second elongated portion to form a respective channel region, other portion of the pillar forming a respective body region, each memory cell also comprising a respective gate oxide/gate dielectric multi-layer overlaying the base side face of the corresponding pillar of the semiconductor material, and a respective gate conductor overlaying the gate oxide/gate dielectric multi-layer;
   a plurality of first sub-bit lines, which each is formed at the first semiconductor layer, corresponds to one of the memory cells and to one of the bit lines, and connects between the drain region of the corresponding memory cell and the corresponding bit line;
   a plurality of second sub-bit lines, which is formed at the second semiconductor layer, corresponds to one of the memory cells, and connects the source region of the corresponding memory cell;
   a plurality of word lines, which each corresponds to one of the columns and connects the gate conductors along the corresponding column;
   a second insulating layer, formed on the second semiconductor layer, the first isolation stripes and the second isolation stripes;
   a plurality of grounded via contacts, which each corresponds to one of the second sub-bit lines and is formed through the second insulating layer to connect the corresponding second sub-bit line; and
   a grounding layer, formed on the second insulating layer to connect all of the grounded via contacts.

2. The NOR-type memory device of claim 1, wherein each base side face is planar, convex or concave, in each memory cell, a combination of the first top face of the pillar of the semiconductor material, a second top face of the gate oxide/gate dielectric multi-layer and a third top face of the gate conductor exhibits one selected from the group consisting of a semi-ellipse, a semi-circle, a triangle, a finger-like shape and a trapezoid.

3. The NOR-type memory device of claim 1, wherein a cell size of each memory cell is equal to 3.5 times a square of a process feature size.

4. The NOR-type memory device of claim 1, further comprising:
   a third insulating layer, formed to overlay the semiconductor substrate and the bit lines and formed between the first isolation stripes, the second isolation stripes and the bit lines; and
   a plurality of connection lines which each corresponds to one of the first sub-bit lines and to one of the bit lines and is formed through the third insulating layer to connect between the corresponding first sub-bit line and the corresponding bit line.

5. A NOR-type memory device, comprising:
   a semiconductor substrate, defining a longitudinal direction, a transverse direction, a normal direction, a plurality of columns in the longitudinal direction, and a plurality of rows in the transverse direction;
   a grounding layer, formed on the semiconductor substrate;
   a plurality of first isolation stripes, being formed on the grounding layer and extending in the longitudinal direction, each first isolation stripe having a respective first longitudinal edge and a respective second longitudinal edge;
a plurality of second isolation stripes, being formed on the grounding layer and extending in the longitudinal direction, each second isolation stripe having a respective third longitudinal edge and a respective fourth longitudinal edge, the first isolation stripes and the second isolation stripes being alternatingly arranged;
a plurality of multi-layer stripes, constituted by a first semiconductor layer formed on the grounding layer, a first insulating layer formed on the first semiconductor layer and a second semiconductor layer formed on the first insulating layer, each multi-layer stripe corresponding to one of the first isolation stripes and to one of the second isolation stripes and being located between the corresponding first isolation stripe and the corresponding second isolation stripe, wherein each multi-layer stripe has a plurality of recesses being formed at the first insulating layer and facing the third longitudinal edge or the fourth longitudinal edge of the corresponding second isolation stripe, the recesses at one side of each first isolation stripe and the recesses at the other side of said one first isolation stripe are staggeredly arranged, each recess corresponds to one of the columns and to one of the rows;
a plurality of memory cells, each of the memory cells corresponding to one of the recesses and comprising a respective pillar of a semiconductor material, each pillar of the semiconductor material being fitted in the corresponding recess and extending in the transverse direction and having a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the first top face, the base side face, the front side face and the rear side face to form a respective drain region, a respective second elongated portion sandwiched among the bottom face, the base side face, the front side face and the rear side face to form a respective source region, a respective plate portion on the base side face and between the first elongated portion and the second elongated portion to form a respective channel region, other portion of the pillar forming a respective body region, each memory cell also comprising a respective gate oxide/gate dielectric multi-layer overlaying the base side face of the corresponding pillar of the semiconductor material, and a respective gate conductor overlaying the gate oxide/gate dielectric multi-layer;
a plurality of first sub-bit lines, which each is formed at the first semiconductor layer, corresponds to one of the memory cells, and connects between the source region of the corresponding memory cell and the grounding layer;
a plurality of second sub-bit lines, which each is formed at the second semiconductor layer, corresponds to one of the memory cells, and connects the drain region of the corresponding memory cell;
a plurality of word lines which each corresponds to one of the columns and connects the gate conductors along the corresponding column;
a second insulating layer, formed on the second semiconductor layer, the first isolation stripes and the second isolation stripes;
a plurality of bit line via contacts, which each corresponds to one of the second sub-bit lines and is formed through the second insulating layer to connect the corresponding second sub-bit line; and
a plurality of bit lines, formed on the second insulating layer, each bit line corresponding to one of the rows, extending in the corresponding row and connecting the bit line via contacts along the corresponding row.

6. The NOR-type memory device of claim 5, wherein each base side face is planar, convex or concave. in each memory cell, a combination of the first top face of the pillar of the semiconductor material, a second top face of the gate oxide/gate dielectric multi-layer and a third top face of the gate conductor exhibits one selected from the group consisting of a semi-ellipse, a semi-circle, a triangle, a finger-like shape and a trapezoid.

7. The NOR-type memory device of claim 5, wherein a cell size of each memory cell is equal to 3.5 times a square of a process feature size.

8. The NOR-type memory device of claim 5, further comprising:
a third insulating layer, formed to overlay the grounding layer and between the first isolation stripes, the second isolation stripes and the grounding layer; and
a plurality of connection lines which each corresponds to one of the first sub-bit lines and is formed through the third insulating layer to connect between the corresponding first sub-bit line and the grounding layer.

9. A method of fabricating a NOR-type memory device, comprising the steps of:
(a) forming a plurality of bit lines on the semiconductor, wherein the semiconductor substrate defines a longitudinal direction, a transverse direction, a normal direction, a plurality of columns in the longitudinal direction, and a plurality of rows in the transverse direction, each bit line corresponds to one of the rows and extends in the corresponding row;
(b) forming a first semiconductor layer on the bit lines;
(c) forming a first insulating layer on the first semiconductor layer;
(d) forming a second semiconductor layer on the first insulating layer;
(e) forming a plurality of first trenches parallel to the longitudinal direction and through the first semiconductor layer, the first insulating layer and the second semiconductor layer, wherein each first trench has a respective first longitudinal side wall, a respective second longitudinal side wall and a plurality of protrusions protruding inwardly, the protrusions on the first longitudinal side wall and the protrusions on the second longitudinal side wall are staggeredly arranged;
(f) forming a plurality of first isolation stripes which each is filled in one of the first trenches such that a plurality of multi-layer stripes of the first semiconductor layer, the first insulating layer and the second semiconductor layer and the first isolation stripes are alternately arranged;
(g) forming a plurality of second trenches parallel to the longitudinal direction, wherein each second trench is formed on a portion of one of the multi-layer stripes and through the first semiconductor layer, the first insulating layer and the second semiconductor layer, and has a respective third longitudinal side wall and a respective fourth longitudinal side wall;

(h) partially doping the first semiconductor layer and the second semiconductor layer on the third longitudinal side wall and the fourth longitudinal side wall of each second trench to form a plurality of first conductive portions at the first semiconductor layer and a plurality of second conductive portions at the second semiconductor layer, wherein each first conductive portion and each second conductive portion correspond to one of the protrusions;

(i) removing a plurality of retained portions of the first insulating layer which each corresponds to one of the protrusions such that a plurality of recesses are formed on the third longitudinal side walls and the fourth longitudinal side walls of the second trenches, wherein the recesses at one side of each first isolation stripe and the recesses at the other side of said one first isolation stripe are staggeredly arranged, each recess corresponds to one of the columns and one of the rows;

(j) forming a plurality of pillars of a semiconductor material, wherein each pillar of the semiconductor material is fitted in one of the recesses, extends in the transverse direction, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the first top face, the base side face, the front side face and the rear side face to form a respective source region, a respective second elongated portion sandwiched among the bottom face, the base side face, the front side face and the rear side face to form a respective drain region, a respective plate portion on the base side face and between the first elongated portion and the second elongated portion to form a respective channel region, and other portion of the pillar of the semiconductor material forming a respective body region, wherein each of the first conductive portions serves as one of a plurality of first sub-bit lines which each corresponds to one of the pillars and to one of the bit lines and connects between the drain region of the corresponding pillar and the corresponding bit line, each of the second conductive portions serves as one of a plurality of second sub-bit lines which each corresponds to one of the pillars and connects the source region of the corresponding pillar;

(k) forming a plurality of gate oxide/gate dielectric multi-layers which each overlays the base side face of one of the pillars of the semiconductor material;

(l) forming a plurality of conductor layers which each overlays one of the third longitudinal side wall and the fourth longitudinal side wall of one of the second trenches;

(m) partially etching the conductor layers to form a plurality of gate conductors and a plurality of word lines, wherein each gate conductor overlays one of the gate oxide/gate dielectric multi-layers, each word line corresponds to one of the columns and connects the gate conductors along the corresponding column;

(n) forming a plurality of second isolation stripes which each is filled in one of the second trenches;

(o) forming a second insulating layer on the second semiconductor layer, the first isolation stripes and the second isolation stripes;

(p) forming a plurality of grounded via contacts which each corresponds to one of the second sub-bit lines and is formed through the second insulating layer to connect the corresponding second sub-bit line; and (q) forming a grounding layer on the second insulating layer to connect all of the grounded via contacts.

10. The method of claim 9, wherein each base side face is planar, convex or concave, a combination of the first top face of the pillar of the semiconductor material, a second top face of the gate oxide/gate dielectric multi-layer and a third top face of the gate conductor exhibits one selected from the group consisting of a semi-ellipse, a semi-circle, a triangle, a finger-like shape and a trapezoid.

11. The method of claim 9, between step (a) and step (b), further comprising the steps of:

forming a third insulating layer to overlay the semiconductor substrate and the bit lines; and forming a plurality of conductive pads which each corresponds to one of the rows and two of the columns and is formed at the corresponding row and the correspond two columns and through the third insulating layer to contact the bit line along the corresponding row, wherein in step (g), the portions of the conductive pads within the second trenches are removed to change the conductive pads into a plurality of connection lines which each corresponds to one of the first sub-bit lines and to one of the bit lines and connects between the corresponding first sub-bit line and the corresponding bit line.

12. A method of fabricating a NOR-type memory device, comprising the steps of:

(a) forming a grounding layer on the semiconductor, wherein the semiconductor substrate defines a longitudinal direction, a transverse direction, a normal direction, a plurality of columns in the longitudinal direction, and a plurality of rows in the transverse direction;

(b) forming a first semiconductor layer on the grounding layer;

(c) forming a first insulating layer on the first semiconductor layer;

(d) forming a second semiconductor layer on the first insulating layer;

(e) forming a plurality of first trenches parallel to the longitudinal direction and through the first semiconductor layer, the first insulating layer and the second semiconductor layer, wherein each first trench has a respective first longitudinal side wall, a respective second longitudinal side wall and a plurality of protrusions protruding inwardly, the protrusions on the first longitudinal side wall and the protrusions on the second longitudinal side wall are staggeredly arranged;

(f) forming a plurality of first isolation stripes which each is filled in one of the first trenches such that a plurality of multi-layer stripes of the first semiconductor layer, the first insulating layer and the second semiconductor layer and the first isolation stripes are alternately arranged;

(g) forming a plurality of second trenches parallel to the longitudinal direction, wherein each second trench is formed on a portion of one of the multi-layer stripes and through the first semiconductor layer, the first insulating layer and the second semiconductor layer, and has a respective third longitudinal side wall and a respective fourth longitudinal side wall;

(h) partially doping the first semiconductor layer and the second semiconductor layer on the third longitudinal side wall and the fourth longitudinal side wall of each second trench to form a plurality of first conductive portions at the first semiconductor layer and a plurality of second conductive portions at the second semiconductor layer, wherein each first conductive portion and each second conductive portion correspond to one of the protrusions;

(i) removing a plurality of retained portions of the first insulating layer which each corresponds to one of the protrusions such that a plurality of recesses are formed on the third longitudinal side walls and the fourth longitudinal side walls of the second trenches, wherein the recesses at one side of each first isolation stripe and the recesses at the other side of said one first isolation stripe are staggeredly arranged, each recess corresponds to one of the columns and one of the rows;

(j) forming a plurality of pillars of a semiconductor material, wherein each pillar of the semiconductor material is fitted in one of the recesses and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the first top face, the base side face, the front side face and the rear side face to form a respective drain region, a respective second elongated portion sandwiched among the bottom face, the base side face, the front side face and the rear side face to form a respective source region, a respective plate portion on the base side face and between the first elongated portion and the second elongated portion to form a respective channel region, and other portion of the pillar of the semiconductor material forming a respective body region, wherein each of the first conductive portions serves as one of a plurality of first sub-bit lines which each corresponds to one of the pillars and connects between the source region of the corresponding pillar and the grounding layer, each of the second conductive portions serves as one of a plurality of second sub-bit lines which each corresponds to one of the pillars and connects the drain region of the corresponding pillar;

(k) forming a plurality of gate oxide/gate dielectric multi-layers which each overlays the base side face of one of the pillars of the semiconductor material;

(l) forming a plurality of conductor layers which each overlays one of the third longitudinal side wall and the fourth longitudinal side wall of one of the second trenches;

(m) partially etching the conductor layers to form a plurality of gate conductors and a plurality of word lines, wherein each gate conductor overlays one of the gate oxide/gate dielectric multi-layers, each word line corresponds to one of the columns and connects the gate conductors along the corresponding column;

(n) forming a plurality of second isolation stripes which each is filled in one of the second trenches;

(o) forming a second insulating layer on the second semiconductor layer, the first isolation stripes and the second isolation stripes;

(p) forming a plurality of bit line via contacts which each corresponds to one of the second sub-bit lines and is formed through the second insulating layer to connect the corresponding second sub-bit line; and (q) forming a plurality of bit lines on the second insulating layer, each bit line corresponding to one of the rows, extending in the corresponding row and connecting the bit line via contacts along the corresponding row.

13. The method of claim 12, wherein each base side face is planar, convex or concave, a combination of the first top face of the pillar of the semiconductor material, a second top face of the gate oxide/gate dielectric multi-layer and a third top face of the gate conductor exhibits one selected from the group consisting of a semi-ellipse, a semi-circle, a triangle, a finger-like shape and a trapezoid.

14. The method of claim 12, between step (a) and step (b), further comprising the steps of:

forming a third insulating layer to overlay the grounding layer; and forming a plurality of conductive pads which each corresponds to one of the rows and two of the columns and is formed at the corresponding row and the correspond two columns and through the third insulating layer to contact the grounding layer, wherein in step (g), the portions of the conductive pads within the second trenches are removed to change the conductive pads into a plurality of connection lines which each corresponds to one of the first sub-bit lines and connects between the corresponding first sub-bit line and the grounding layer.

* * * * *